(12) United States Patent
Saito et al.

(10) Patent No.: US 6,290,095 B1
(45) Date of Patent: Sep. 18, 2001

(54) CHIP COMPONENT TAKE-IN APPARATUS

(75) Inventors: Koji Saito; Taro Yasuda; Hiroyuki Matsui, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/571,264

(22) Filed: May 15, 2000

Related U.S. Application Data

(63) Continuation of application No. 08/990,298, filed on Dec. 15, 1997, now Pat. No. 6,062,423.

(30) Foreign Application Priority Data

Dec. 17, 1996 (JP) ..................................... 8-337247

(51) Int. Cl.[7] .................................................. B65H 5/00
(52) U.S. Cl. ......................... 221/236; 221/200; 221/163; 221/263
(58) Field of Search ................... 221/263, 236, 221/200, 224, 223, 157, 163, 268; 198/396

(56) References Cited

U.S. PATENT DOCUMENTS

| | | | |
|---|---|---|---|
| 4,457,451 | * | 7/1984 | Ichikawa ............................. 221/190 |
| 4,459,743 | * | 7/1984 | Watanabe et al. ..................... 29/740 |
| 4,763,812 | * | 8/1988 | Sekinoo et al. ...................... 221/203 |
| 5,730,317 | * | 3/1998 | Mitsushima et al. ................ 221/131 |
| 5,934,505 | * | 8/1999 | Shimada .............................. 221/236 |
| 6,062,423 | * | 7/1984 | Saito et al. .......................... 221/236 |

FOREIGN PATENT DOCUMENTS 5-247882  10/1993 (JP) .

* cited by examiner

*Primary Examiner*—Christopher P. Ellis
*Assistant Examiner*—Khoi H. Tran
(74) *Attorney, Agent, or Firm*—Lowe Hauptman Gilman & Berner, LLP

(57) ABSTRACT

A chip component take-in apparatus takes in and guides downward prismatic chip components stored in a bulk state in a storage chamber one by one in a predetermined direction. When a first take-in member and a second take-in member are relatively moved up and down in each flat face contact state, the chip components in face contact with the flat faces of the take-in members are gradually guided to a center along guide ways. The guided chip components in the longitudinal direction thereof are taken into a passage constituted by grooves and are moved downward along the passage by self-weight.

4 Claims, 20 Drawing Sheets

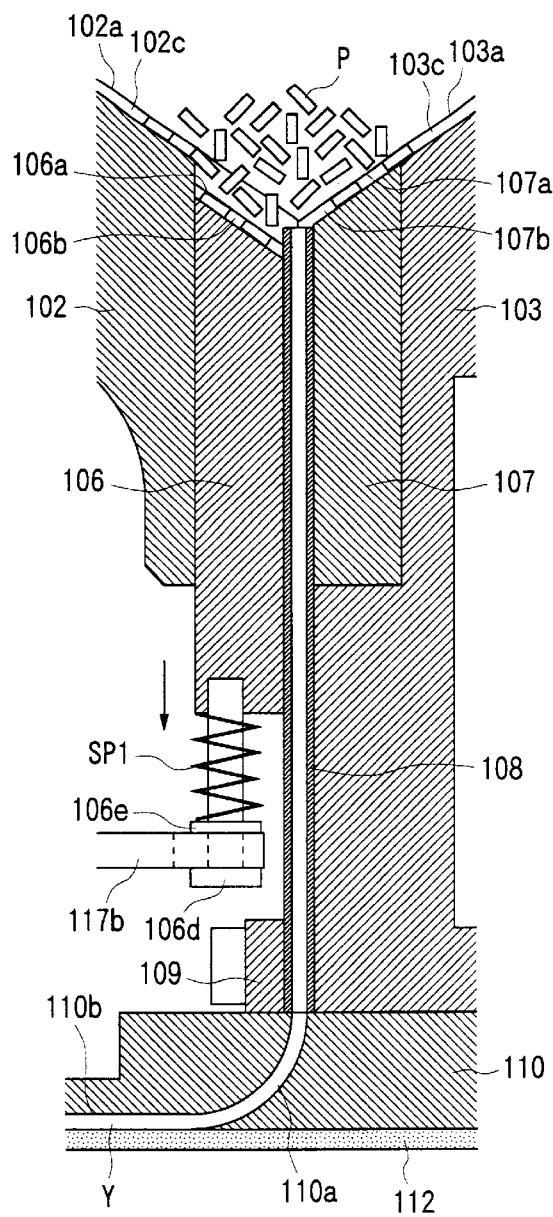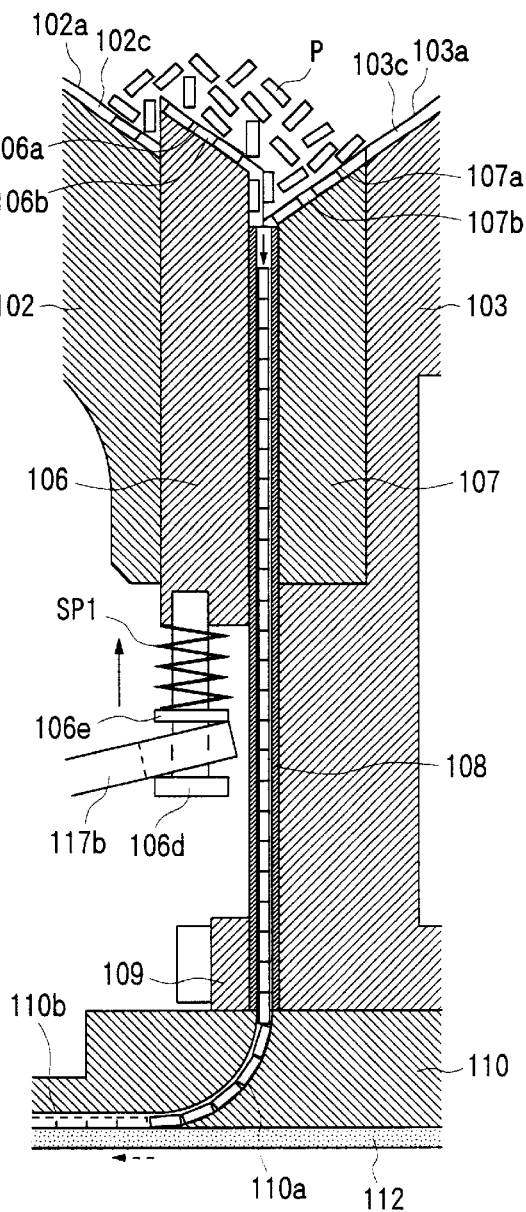

CHIP COMPONENT TAKE-IN APPARATUS

This application is a continuation of application Ser. No. 08/990,298 filed Dec. 15, 1997, now U.S. Pat. No. 6,062,423.

BACKGROUND OF THE INVENTION

1. Field of the Invention

The present invention relates to a chip component take-in apparatus which prismatic chip components in a bulk state in a storage chamber are taken in one by one in a predetermined direction and are guided downward. The chip component take-in apparatus can be employed as a component take-in mechanism in a chip component feeding apparatus such as a bulk feeder.

2. Description of the Prior Art

A conventional chip component take-in apparatus of the above kind is disclosed, for example, in Japanese Patent Application Laid-Open No. 6-232596.

The chip component take-in apparatus disclosed in the aforementioned publication is equipped with a housing box for storing a large number of chip components in a bulk state, a component take-in pipe inserted into the lower face of the housing box so that it is movable up and down, and a component conveying tube disposed inside the component take-in pipe.

In the chip component take-in apparatus, the chip components within the housing box are taken into the component take-in pipe one by one in the longitudinal direction of the chip component, by moving the component take-in pipe up and down. The chip components taken into the component take-in pipe are moved downward along the pipe by self-weight.

However, since the aforementioned conventional chip component take-in apparatus has been designed for taking in cylindrical chip components, it is very difficult to handle prismatic chip components such as those shown in FIGS. 2(a) and 2(b).

That is, in the case of the prismatic chip components shown in FIGS. 2(a) and 2(b), it is necessary to arrange in a proper posture the four side faces excluding the longitudinal end faces to take them in. The aforementioned apparatus, however, cannot perform the control of such a posture.

In order to perform the posture control, it is easily conceivable to set the cross sectional shape of the interior holes of the component take-in pipe and component conveying pipe with the end face shape of the chip component. However, in the aforementioned apparatus in which the component take-in pipe is moved up and down in the outside of the component conveying pipe, there is the possibility that the take-in operation will be frequently erred, because the probability that prismatic chip components are taken into the component take-in pipe is low.

SUMMARY OF THE INVENTION

The object of the present invention is to provide a chip component take-in apparatus which is capable of taking in and guiding downward prismatic chip components one by one in a predetermined direction with stability and efficiency.

In carrying out our invention in one preferred mode, there is provided a chip component take-in apparatus comprising a chamber for storing prismatic chip components in a bulk state, two take-in members disposed under the chamber and movable relatively in a face contact state, and a passage provided between the two take-in members for taking in and guiding downward the chip components one by one in a predetermined direction by self-weight when the two take-in members are moved relatively in the face contact state.

The above and other objects, features and advantages of the present invention will become apparent from the detailed description to follow taken in conjunction with the appended claims.

BRIEF DESCRIPTION OF THE DRAWINGS

FIGS. 24 (a) and 24(b) are a partial enlarged vertical sectional view and an operational explanatory view showing the chip component feeding apparatus shown FIG. 16;

DESCRIPTION OF THE PREFERRED EMBODIMENTS

Figure 1:
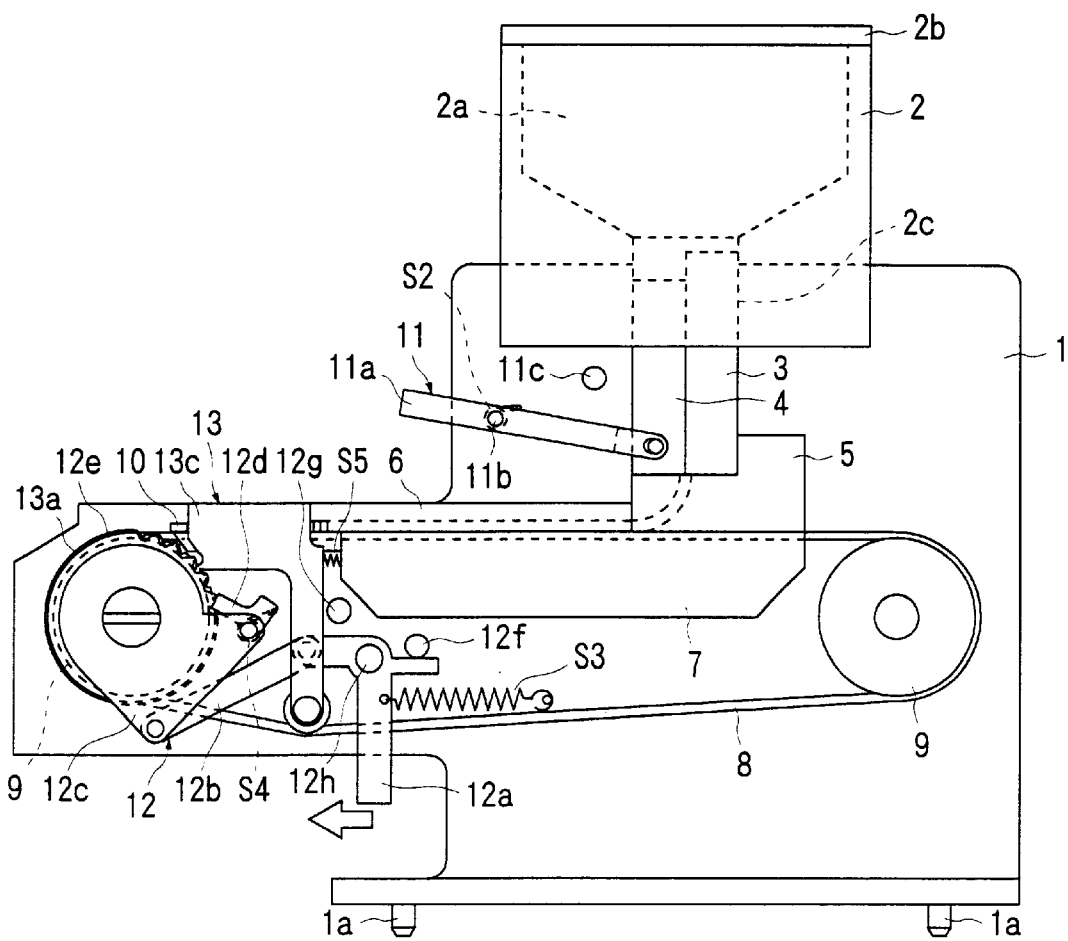
FIG. 1 is a side view showing a chip component feeding apparatus according to a first embodiment of the present invention.
Figure 2:
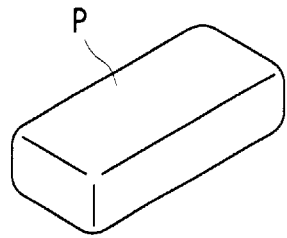
FIGS. 2(a) and 2(b) are perspective views showing chip components.
Figure 2:
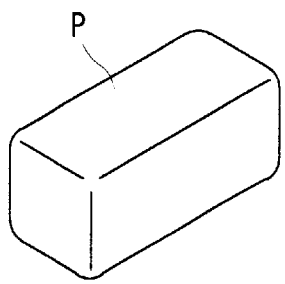

Referring to FIGS. 1 to 10, there is shown a first embodiment of the present invention that is applied to a chip component feeding apparatus.

In the figures, reference numeral 1 denotes a frame, 2 a hopper, 3 a first take-in member, 4 a second take-in member, 5 a first component guide, 6 a second component guide, 7 a belt guide, 8 a belt, 9 a pair of front and rear pulleys, 10 a component stopper, 11 a take-in member up-and-down moving mechanism for moving the second take-in member 4 up and down, 12 a belt driving mechanism for intermittently moving the belt 8, and 13 a component stopper displacement mechanism for reciprocating the component stopper 10 back and force.

The frame 1 fulfills a role of supporting constituent members to be described later. As shown in FIG. 1, on the lower face of the frame 1 there are provided two attaching pins 1a which are inserted into positioning holes provided in an other utensil (not shown).

Figure 3:
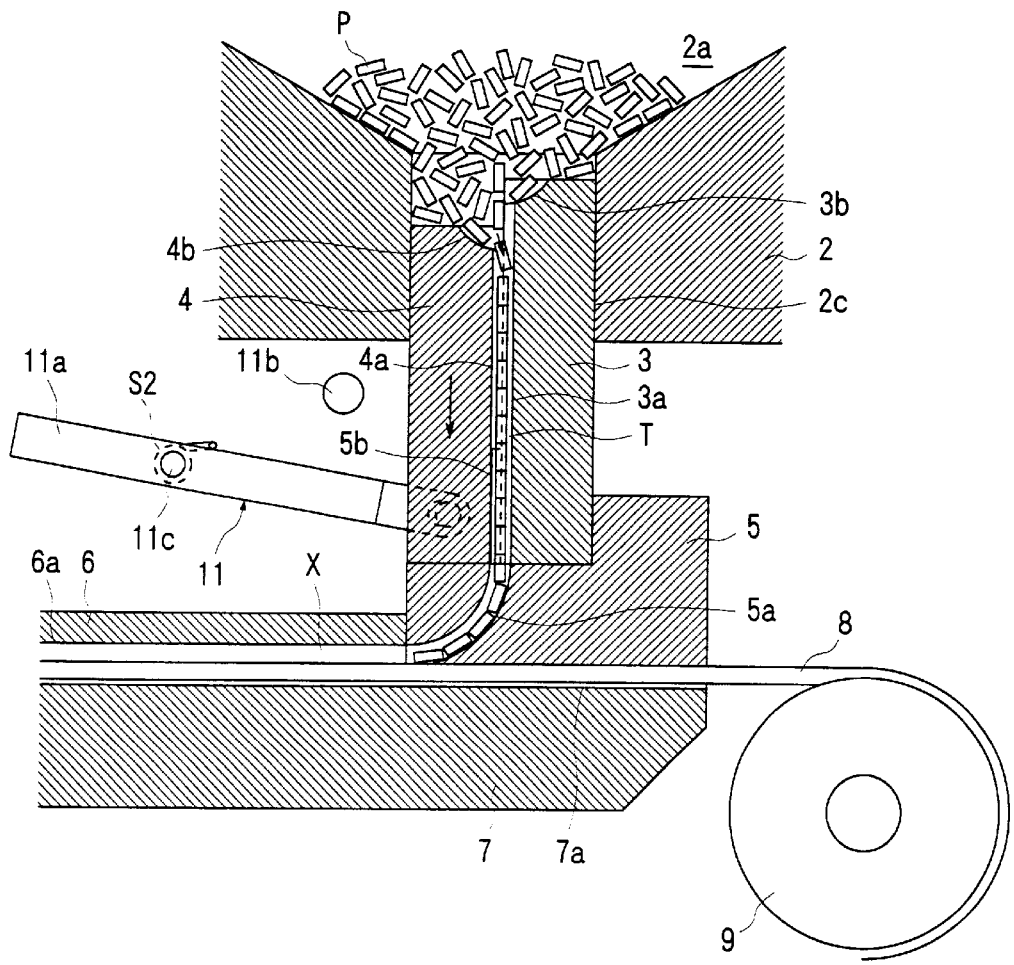
FIG. 3 is a partial enlarged vertical sectional view showing the chip component feeding apparatus shown in FIG. 1.
Figure 4:
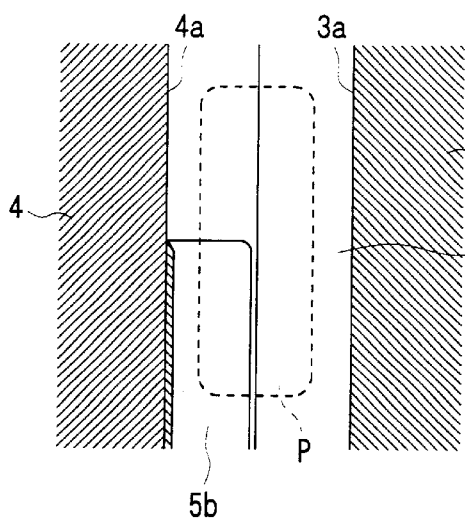
FIGS. 4(a) and 4(b) are partial sectional views showing the arrangement state of the guide member.
Figure 4:
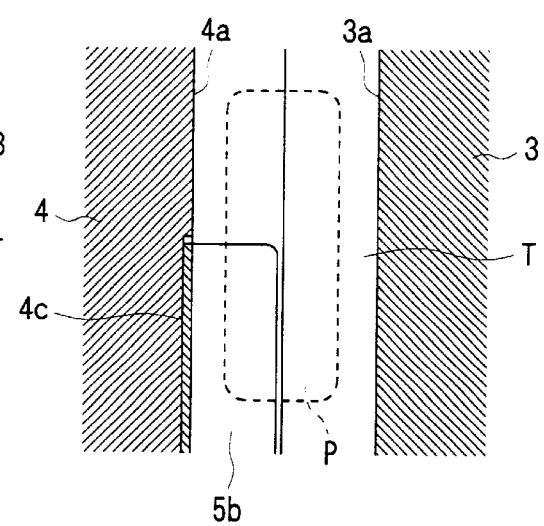

The hopper 2, as shown in FIGS. 1 and 3, has side faces removably fixed on the frame 1. This hopper 2 comprises a storage chamber 2a, a lid plate 2b for covering the upper opening of the storage chamber 2a so that the opening can be freely opened and closed, and a through hole 2c formed at the bottom of the storage chamber 2a for inserting take-in members. At least the front face of the hopper 2 is transparent so that the quantity of the components within the storage chamber 2a can be viewed from the outside. The cross sectional shape of the through hole 2c is substantially the same as that of the first and second take-in members 3 and 4 when their flat faces come into contact with each other.

The aforementioned storage chamber 2a is stored a large number of one kind of prismatic chip components P in a bulk state. The chip components P have a relation of length>width>height such as that shown in FIG. 2(a). The chip components P are represented, for example, by chip capacitors, chip inductors, and chip resisters. The chip component P has external electrode and internal conductor, and can be attracted by a permanent magnet M to be described later. The chip components P stored within the storage chamber 2a are moved downward along the bottom inclination by self-weight when they are supplied. Of course, if the cross sectional shape of a vertical passage T to be described later is changed, a prismatic chip component P with a relation of length>width=height such as that shown in FIG. 2(b) can also be taken in.

Figure 5:
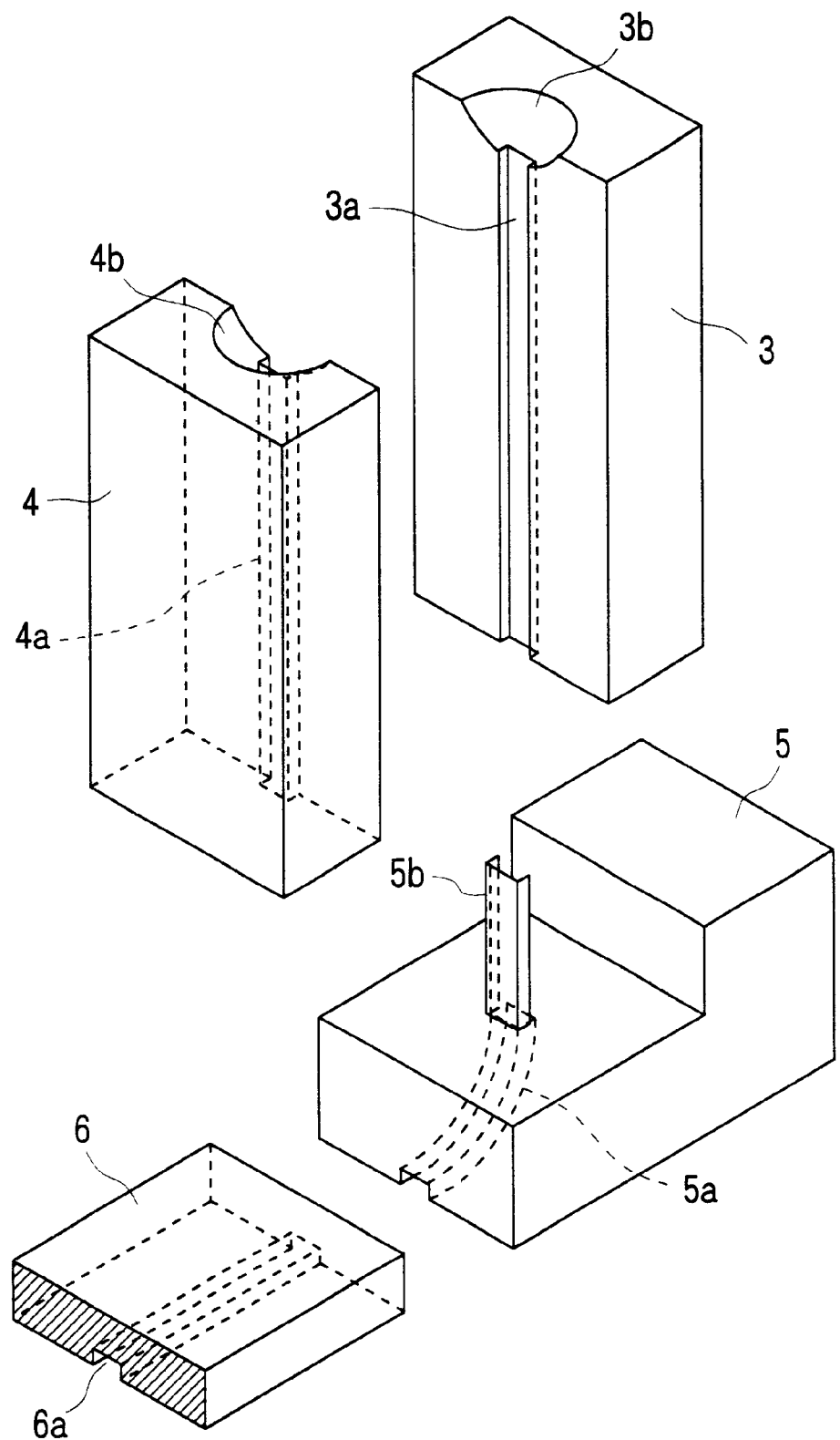
FIG. 5 is an exploded perspective view showing the take-in members and component guide shown in FIG. 1.

The first take-in member 3, as shown in FIGS. 1, 3 and 5, forms a rectangular parallelepiped, which has a predetermined width, thickness, and length. This first take-in member 3 is fixed to the first component guide 5 at the lower end thereof, and is vertically inserted and disposed within the through hole 2c in a positional relationship such that the upper end of the first take-in member 3 becomes slightly lower than that of the through hole 2c. Also, in the flat face of the first take-in member 3 which contacts the flat face of the second take-in member 4, a rectangular sectional shaped groove 3a with a predetermined width and depth is formed in the center of the width direction. Furthermore, in the upper end of the first take-in member 3, a guide way 3b consisting of a curved face of about a quarter of a spherical face is formed, and the deepest portion of the guide way 3b is continuous to the upper end of the groove 3a.

The second take-in member 4, as shown in FIGS. 1, 3, and 5, forms a rectangular parallelepiped, which has the same width and thickness as the first take-in member 3 and a length shorter than the first take-in member 3. This second take-in member 4 contacts the first component guide 5 at the lower end thereof, and is vertically inserted and disposed within the through hole 2c so as to be movable up and down in a positional relationship such that the upper end of the second take-in member 4 becomes slightly lower than the upper end of the first take-in member 3. Also, in the flat face of the second take-in member 4 which contacts the flat face of the first take-in member 3, a rectangular sectional shaped groove 4a with the same width and depth as the groove 3a of the first take-in member 3 is formed in the center of the width direction. furthermore, in the upper end of the second take-in member 4, a guideway 4b consisting of acurved face of about a quarter of a spherical face is formed, and the deepest portion of the guide way 4b is continuous to the upper end of the groove 4a.

The grooves 3a and 4a formed in the first and second take-in members 3 and 4 constitute a vertical passage T in the state where the two flat faces of the take-in members 3 and 4 are in contact with each other. The cross sectional shape of the vertical passage T is similar to the end face shape of the chip component P. In the vertical passage T, prismatic chip components P can be taken in one by one in such a manner that the direction of the chip component P is turned in the longitudinal direction thereof and also one of the two widest faces the first take-in member 3 and the other faces the second take-in member 4. The chip component P taken into the vertical passage T is moved downward along the vertical passage T by self-weight. Also, there is no special limit to the curvature of the curved face constituting the guide ways 3b and 4b, but in order to smoothly guide the chip component P within the storage chamber 2a toward the vertical passage T, it is preferable to have such a curvature value not as to stick any face of 6 faces of the chip component P.

The first component guide 5, as shown in FIGS. 1, 3, and 5, is on the upper side of the belt 8, and the side face is fixed to the frame 1. This first component guide 5 has an interior curved passage 5a, which is continuous to the lower opening of the aforementioned vertical passage T and has a predetermined curvature at the passage center. This curved passage 5a has an angle range of a little under 90 degree when viewed from the side face, and the cross sectional shape is nearly equal to or slightly larger than that of the vertical passage T. That is, in the curved passage 5a the chip component P from the vertical passage T can be moved downward by self-weight, and the vertical posture of the chip component P can be changed to a nearly transverse posture when passed through the curved passage 5a. Also, the portion of the curved passage 5a near the belt 8 is cut out in parallel to the belt surface so that the chip component P can be smoothly discharged from the curved passage 5a to the belt 8.

In addition, the first component guide 5 is provided with a vertical guide member 5b consisting of a rectangular sectional shaped thin plate. The lower end of the guide member 5b is fixed to the upper opening of the curved passage 5a, while the upper end is inserted and disposed within the groove 4a of the second take-in member 4. This guide member 5b fulfills both a role of filling up the gap which occurs between the second take-in member 4 and the first component guide 5 when the second take-in member 4 rises and a role of guiding the chip component P in the vertical passage T downward.

FIGS. 4(a) and 4(b) show the arrangement state of the guide member 5b. In FIG. 4(a) the guide member 5b is disposed so that the exterior face contacts the interior face of the groove 4a. In FIG. 4(b) a recess 4c equivalent to the thickness of the guide member 5b is provided in the interior face of the groove 4a, and the guide member 5b is fitted into the recess 4c. Even in either case the thickness of the guide member 5b is thinner than the clearance between the vertical passage T and the chip component P. Also, the upper end of the guide member 5b is chamfered or rounded so that the chip component P is not caught by the upper end.

The second component guide member 6, as shown in FIGS. 1, 3, 5, and 7, is on the upper side of the belt 8, and the side face is fixed to the frame 1. The lower face of the second component guide member 6 has a rectangular sectional shaped linear groove 6a which is continuous to the lower opening of the curved passage 5a. The opening of the linear groove 6a is closed by the upper face of the belt 8, thereby forming a conveyor passage X along which chip component P are guided. The cross sectional shape of the conveyor passage X is nearly identical with that of the curved passage 5a, and the chip components P from the curved passage 5a can be conveyed forward in the longitudinally aligned state according to movement of the belt 8. Also, in front of the front end of the linear groove 6a, a component take-out port 6b is formed for taking out the foremost chip component P to the outside. Furthermore, in the front side face of the linear groove 6a, a hole 6c is formed for inserting a component hold pin 13f to be described later.

Figure 7:
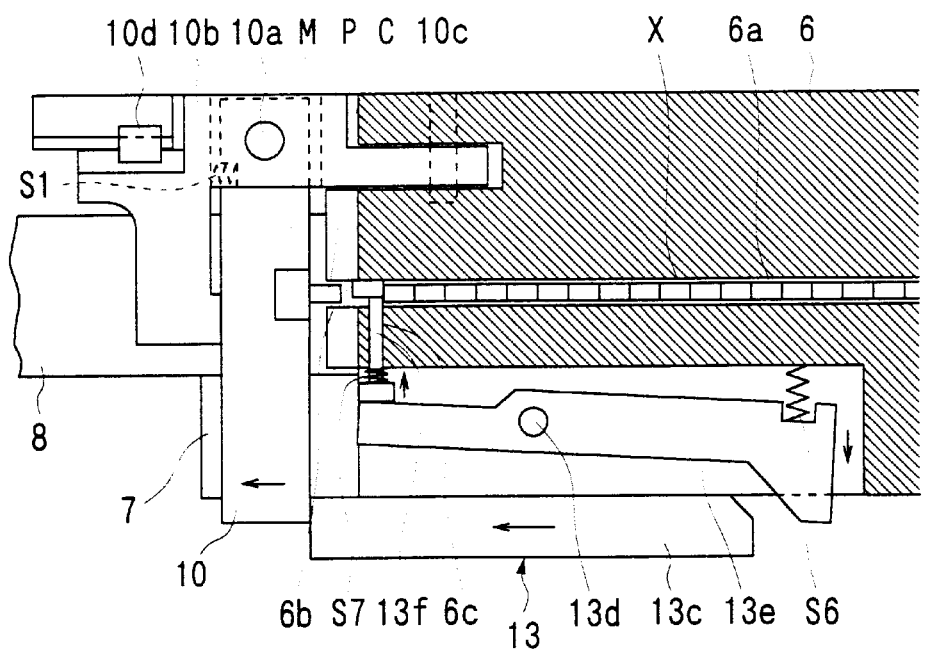
FIG. 7 is a partial enlarged top view, partly broken away, showing the chip component feeding apparatus shown in FIG. 1.

The belt guide 7, as shown in FIGS. 3 and 7, is on the lower side of the belt 8, and the side face is fixed to the frame 1. The belt guide 7 has a linear groove 7a in the upper face, and the linear groove 7a has a predetermined width and depth slightly greater than the width and thickness of the belt 8. The center in the width direction of the linear groove 7a is aligned with that of the linear groove 6a of the second component guide 6.

The belt 8, as shown in FIGS. 1, 3, and 7, comprises a non-magnetic and endless flat belt or timing belt formed from synthetic rubber or flexible resin. This belt 8 is wound on a pair of pulleys 9 supported by the frame 1 at the front and rear positions of the belt guide 7 so that the belt can be freely rotated. The lower face of the belt 8 is positioned within the linear groove 7a of the belt guide 7, while the upper face of the belt 8 is contacted with the lower faces of the first and second component guides 5 and 6 by the winding tension of the belt 8 so that the belt is movable back and forth.

The component stopper 10, as shown in FIGS. 1 and 7, comprises a non-magnetic rectangular plate with the same thickness as the depth of the linear groove 6a of the second component guide 6. This component stopper 10 is supported at one end thereof by a stopper support member 10b through a pin 10a and is rotatable parallel to the belt surface at the front side position of the linear groove 6a. Also, the component stopper 10 is urged in a counterclockwise direction in FIG. 7 by a coil spring S1 tensioned between the stopper 10 and the stopper support member 10b. The component stopper 10 ensures an expected component stopping position when one face thereof abuts the front end of the component take-out port 6b (see FIG. 10). Furthermore, at the position at which the component stopper 10 faces the foremost chip component P, a rare earth permanent magnet M in the form of a rectangular parallelepiped is provided so that either the N pole or the S pole contacts the foremost chip component P. In the illustration example, while the height of permanent magnet M is nearly equal to the thickness of the component stopper 10 and the width is greater than that of the chip component P, the height of permanent magnet M may be less than that of the component P and the width may also be less than that of the chip component P.

In the illustration example, one end of the stopper support member 10b for freely rotatably supporting the component stopper 10 is inserted into the front portion of the second component guide 6 through a pin 10c so as to be freely rotatable in a upward direction so that the chip component P within the conveyor passage X can be simply exhausted to the outside. The front portion of the stopper support member 10b engages a plate spring 10d provided on the front end of the second component guide 6, thereby holding the component stopper 10 in a state parallel to the belt surface. Also, when the stopper support member 10b is disengaged from the plate spring 10d and rotated upward, the component stopper 10 can be separated from the belt 8. That is, if the component stopper 10 is separated upward from the belt 8 by the upward rotation of the stopper support member 10b, the chip component P within the conveyor passage X can be exhausted from the front end to the outside.

The take-in member up-and-down moving mechanism 11, as shown in FIGS. 1 and 3, comprises a control lever 11a, a pin 11b for supporting the control lever 11a so that the control lever 11a can be freely rotated, a positioning stopper 11c for prescribing the rotation limiting position of the control lever 11a, and a coil spring S2 for urging the control lever 11a in the clockwise direction of FIG. 3.

The central portion of the control lever 1a is supported by the frame 1 through the support pin 11b so as to be freely rotatable, and the tip of the lever 11a is rotatably connected with the second take-in member 4. This control lever 11a is rotatable up and down, and in the stand-by state, the lower end of the second take-in member 4 is pressed against the upper face of the first component guide 5 by the urging force of the coil spring S2.

Figure 8:
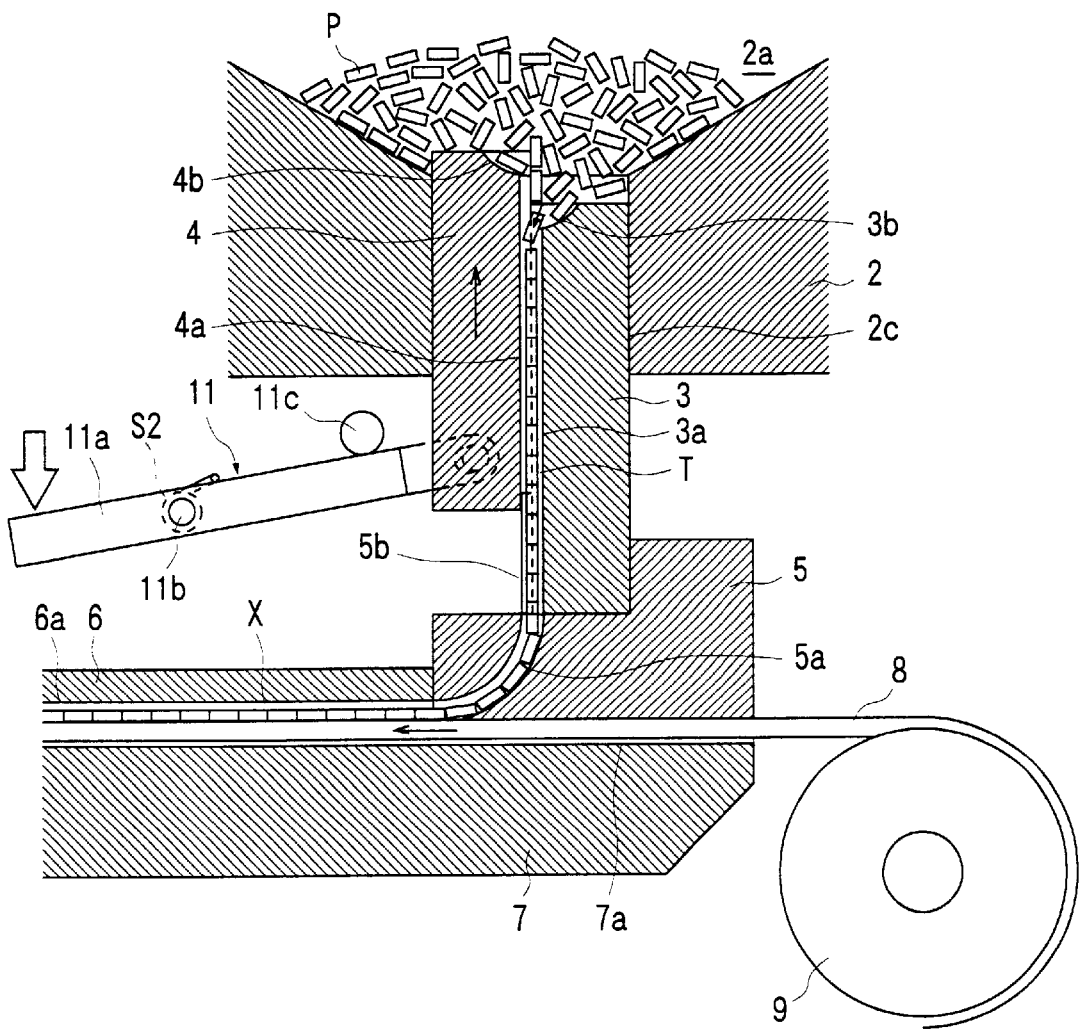
FIG. 8 is an operational explanatory view corresponding to FIG. 3.
Figure 9:
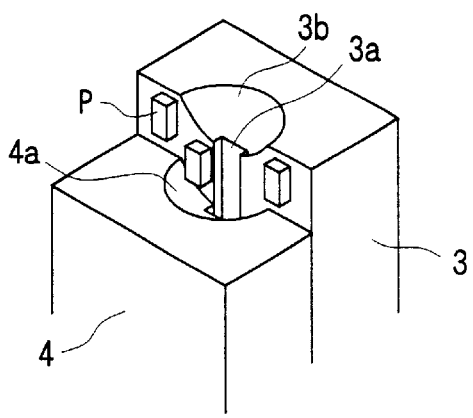
FIGS. 9(a) to 9(e) are explanatory views showing components take-in action.
Figure 9:
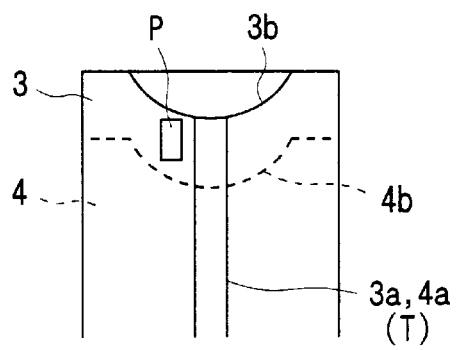
Figure 9:
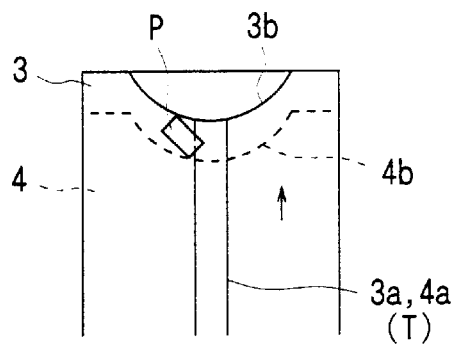
Figure 9:
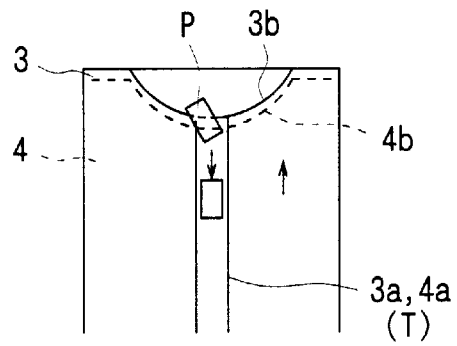
Figure 9:
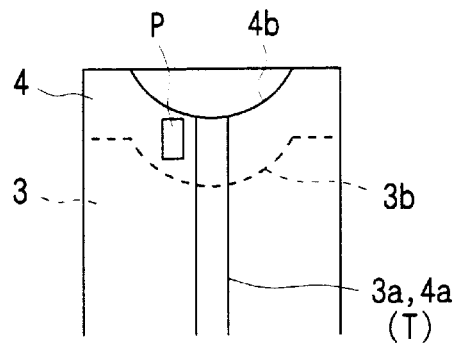

In the take-in member up-and-down moving mechanism 11, as shown in FIG. 8, when external force (indicated by a white arrow in FIG. 8) is applied to the end portion of the control lever 11a, then the control lever 11a is rotated on the pin 11b in the counterclockwise direction and the second take-in member 4 can be moved upward from its lowering position. Also, in the position shown in FIG. 8, when the force applied to the end portion of the control level 11a is released, the second take-in member 4 is moved downward from the rising position by the urging force of the coil spring S2 and can be returned to the stand-by position shown in FIG. 3.

Figure 6:
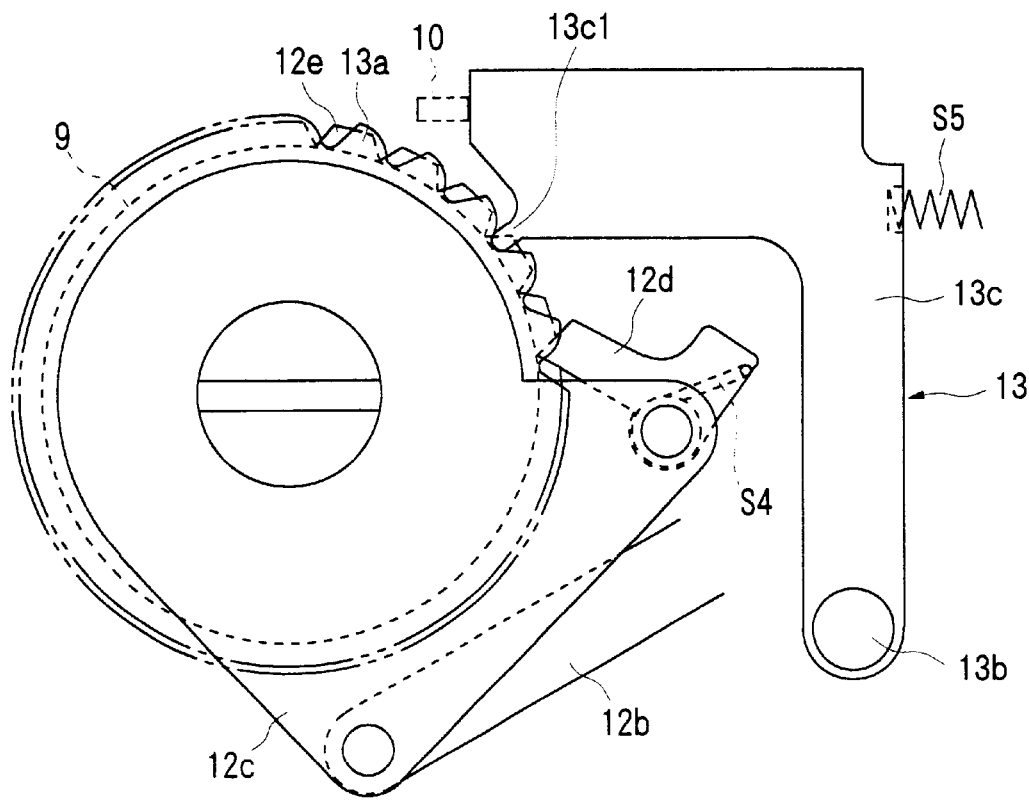
FIG. 6 is a partial enlarged side view showing the chip component feeding apparatus shown in FIG. 1.

The belt driving mechanism 12, as shown in FIGS. 1 and 6, comprises a control lever 12a, a relay lever 12b rotatably connected to the control lever 12a, a wheel actuation lever 12c rotatably connected to the relay lever 12b and rotatable on the same axis as the front pulley 9, a ratchet 12d rotatably connected to the wheel actuation lever 12c, a ratchet wheel 12e fixed coaxially to the front pulley 9, a positioning stopper 12f for prescribing the return position of the control lever 12a, a positioning stopper 12g for prescribing the rotation limiting position of the control lever 12a, a coil spring S3 for urging the control lever 12a in a counterclockwise direction, and a coil spring S4 for pressing the ratchet 12d against the valley portion of the ratchet wheel 12e.

The central portion of the control lever 12a is supported by the frame 1 through a pin 12h so that the control lever 12a can be freely rotatable. This control lever 12a is rotatable in an up-and-down direction, and in the stand-by position, it abuts the positioning stopper 12f by the urging force of the coil spring S3. Also, on the circumference of the ratchet wheel 12e, valley portions and ridge portions are alternately provided at intervals of a predetermined angle pitch.

In the belt driving mechanism 12, when external force (indicated by white arrow in FIG. 1) is applied to the end portion of the control lever 12a, then the control lever 12a is rotated in the clockwise direction and the wheel actuation lever 12c is rotated in the counterclockwise direction through the relay lever 12b. Next, when the ratchet wheel 12e engaged by the ratchet 12d of the wheel actuation lever 12c is rotated through a predetermined angle in the counterclockwise direction along with the front pulley 9, the belt 8 is moved only a distance corresponding to the rotated angle. More particularly, the belt 8 can be advanced a predetermined distance longer than the length of the chip component P. Also, when the force applied to the end portion of the control lever 12a is released, the wheel actuation lever 12c is rotated to its original position through the relay lever 12b by the urging force of the coil spring S3, therefore the ratchet 12d of the wheel actuation lever 12c is moved into the adjacent valley portion in the clockwise direction.

The component stopper displacement mechanism 13, as shown in FIGS. 1, 6, and 7, comprises a cam wheel 13a fixed coaxially to the front pulley 9, a stopper actuation lever 13c rotatably supported on the side face of the frame 1 through a pin 13b, a coil spring S5 for urging the stopper actuation lever 13c forward to press the actuating protrusion 13c against the circumferential face of the cam wheel 13a, a pin actuation lever 13e horizontal movably attached to the front portion of the second component guide 6 through a pin 13d, a coil spring S6 for urging the pin actuation lever 13e in a clockwise direction of FIG. 7, a component hold pin 13f inserted in a hole 6c provided in the front side face of the linear groove 6a, and a coil spring S7 for urging the component hold pin 13f outward. On the circumference of the cam wheel 13a, valley portions and ridge portions are alternately provided at the intervals of the same angle pitch as the ratchet wheel 12e. Also, a force relation of S6>S7 is set to the coil springs S6 and S7.

At the stand-by position where the stopper actuation lever 13c is at its forward position, as shown in FIG. 6, the actuating protrusion 13c1 of the stopper actuation lever 13c is pressed against to one valley portion of the cam wheel 13a by the urging force of the coil spring S5. With this, as shown in FIG. 7, the pin actuation lever 13e is urged in the clockwise direction by the coil spring S6. The component hold pin 13f is inserted into the linear groove 6a against the urging force of the coil spring S7, and the second foremost chip component P is pressed against the inner face of the linear groove 6a and held at that position by the component hold pin 13f. Also, by the pressing force of the stopper actuation lever 13c, the component stopper 10 is displaced forward (component take-out position apart forward from component stopping position) against the urging force of the coil spring S1. The foremost chip component P is displaced forward along with the component stopper 10 while it is being attracted by the permanent magnet M, and is separated from the second chip component P.

In this component displacement mechanism 13, in the process where the cam wheel 13a is intermittently rotated counterclockwise at intervals of a predetermined angle pitch along with the ratchet wheel 12e of the aforementioned belt driving mechanism 12, the stopper actuation lever 13c is rotated rearward a predetermined angle from the stand-by position and is returned from the rearward rotated position to the stand-by position by the undulations of the valley and ridge portions of the cam wheel 13a.

Figure 10:
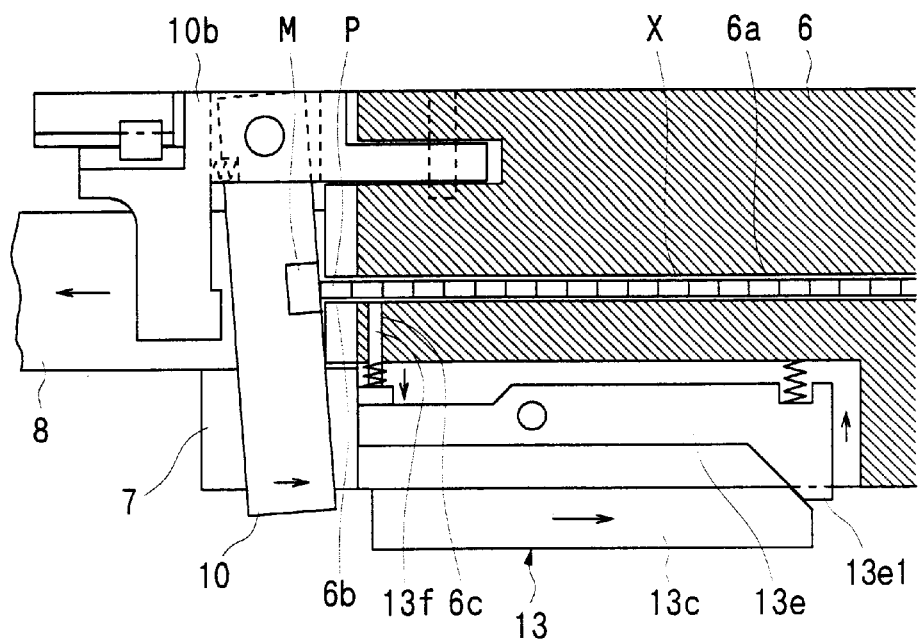
FIG. 10 is an operational explanatory view corresponding to FIG. 7.

When the stopper actuation lever 13c is rotated rearward from the stand-by position, the component stopper 10 abuts the front end of the component take-out port 6b by the urging force of the coil spring S1 and ensures the component stopping position, as shown in FIG. 10. At the same time, the actuating protrusion 13e1 of the rear end of the pin actuation lever 13e is pushed inward against the urging force of the coil spring S6 by the stopper actuation lever 13c and is rotated in the counterclockwise direction of FIG. 10. Also, the component hold pin 13f is moved outward by the urging force of the coil spring S7 and the holding of the second chip component P is released. As a result, the alignment conveyance of chip components P in the transverse passage T becomes possible.

The operation of the aforementioned chip component feeding apparatus will hereinafter be described.

When the foremost chip component P is taken out of the component take-out port 6b by means of a suction nozzle (not shown), the end portion of the control lever 11a of the take-in member up-and-down moving mechanism 11 and the end portion of the control lever 12a of the belt driving mechanism 12 are pushed at the same time by a portion of the suction nozzle or another drive unit.

In the state where the second take-in member 4 is at its lowering position, the upper end of the second take-in member 4 is at a lower position than the upper end of the first take-in member 3, as shown in FIG. 3. At this time, the distance between the upper ends of the first and second take-in members 3 and 4 is longer than the length of the component chip P, and a small quantity of chip components P have been taken into the stepped portion between the take-in members 3 and 4. The chip components P within the stepped portion take various posture, however, as shown in FIGS. 9(a) and 9(b), for some chip components, the widest face is in face contact with the flat face of the first take-in member 3 exposed to the stepped portion.

Now, when the end portion of the control lever 11a of the take-in member up-and-down moving mechanism 11 is pushed, the second take-in member 4 is raised a predetermined stroke from the lowering position in the state where the second take-in member 4 is in face contact with the first take-in member 3, as previously described. The upper end of the second take-in member 4 is slightly inserted into the storage chamber 2a.

In the process where the second take-in member 4 linearly moves from the lowering position to the rising position, as shown in FIG. 8, the chip components P within the stepped portion are lifted upward and the chip components within the storage chamber 2a are subjected to a disentangling operation, by the second take-in member 4.

Also, in the aforementioned process, the chip component P in face contact with the flat face of the first take-in member 3, as shown in FIGS. 9(c) and 9(d), is gradually guided to the center by the guide way 4b of the second take-in member 4 being raised. Next, the direction of the chip component P is turned in the longitudinal direction thereof and is taken into the vertical passage T constituted by the grooves 3a and 4a. The chip component P in the longitudinal direction is moved downward along the vertical passage T by self-weight.

In the state where the second take-in member 4 is at the rising position, as shown in FIG. 8, the upper end of the second take-in member 4 is at a higher position than that of the first take-in member 3. At this time, the distance between the upper ends of the first and second take-in members 3 and 4 is longer than the length of the component chip P, and a small quantity of chip components P have been taken into the stepped portion between the take-in members 3 and 4. Each of the chip components P within the stepped portion takes various posture, however, as shown in FIG. 9(e), for some chip components, the widest face is in face contact with the flat face of the second take-in member 4 exposed to the stepped portion.

Now, when the pushing force applied to the end portion of the control lever 11a of the take-in member up-and-down moving mechanism 11 is released, the control lever is returned to the original position, as previously described. As a result, the second take-in member 4 is lowered a predetermined stroke from the rising position and returned to the original position by the return of the control lever 11a, in the state where the second take-in member 4 is in face contact with the first take-in member 3.

In the process where the second take-in member 4 is moved from the rising position to the lowering position, as shown in FIG. 3, the entire stored chip components go down by the falling of the second take-in member 4, and a small quantity of chip components P are again taken into the stepped portion between the first and second take-in members 3 and 4.

Also, in the aforementioned process, the chip component P in face contact with the flat face of the second take-in member 4, as with FIGS. 9(c) and 9(d), is gradually guided to the center by the guide way 3b of the first take-in member 3 being relatively raised. Next, the direction of the chip component P is turned in the longitudinal direction thereof and is taken into the vertical passage T constituted by the grooves 3a and 4a. The chip component P in the longitudinal direction is moved downward along the vertical passage T by self-weight.

Thus, the take-in operation of the chip component P into the vertical passage T constituted by the grooves 3a and 4a of the take-in members 3 and 4 is performed in both the rising process and the falling process of the second take-in member 4. The prismatic chip components P are taken one by one into the vertical passage T in such a posture that the chip component P is in the longitudinal direction thereof and that one of the two opposite widest faces of the chip component faces the first take-in member 3 and the other faces the second take-in member 4.

The chip components P, taken into the vertical passage T one by one in the longitudinal direction, are moved downward along the vertical passage T by self-weight while being guided by the guide member 5b, and go into the curved passage 5a. The chip components P within the curved passage 5a are moved downward along the curved passage 5a by self-weight according to the curvature of the curved passage 5a, and the vertical posture is changed to a nearly transverse posture. The foremost chip component P, after passed through the curved passage 5a, abuts the face of the belt 8 at the front face thereof, and the following chip components P in the longitudinal direction are aligned behind the foremost chip component P (see FIG. 3).

On the other hand, when the end portion of the control lever 12a of the belt driving mechanism 12 is pushed, the relay lever 12b and the wheel actuation lever 12c are rotated. Therefore, the ratchet wheel 12e engaged by the ratchet 12d is rotated a predetermined angle in the counterclockwise direction along with the front pulley 9, and the belt 8 is moved forward a distance corresponding to the rotated angle. More particularly, the belt 8 is moved a longer distance than the length of the chip component P.

In the process where the belt 8 is moved forward a predetermined distance, the chip component P with the front end abutting the belt surface is pulled out forward by the frictional resistance between it and the belt 8 and lies on the belt 8, and the front end of the next chip component P abuts the belt surface (see FIG. 8).

The intermittent movement of the belt 8 is repeated each time the control lever 12a is pushed, that is, each time the foremost chip component P is taken out of the component take-out port 6b, and consequently, the chip components P aligned within the curved passage 5a are pulled out forward in sequence. With this, a plurality of chip components P are aligned, while they are being subjected to an alignment operation by the linear groove 6a of the second component guide 6. The chip components P in the aligned state are conveyed forward in correspondence with the intermittent movement of the belt 8.

When the ratchet wheel 12e of the belt driving mechanism 12 is rotated with the front pulley 9 and the belt 8 is moved forward, the stopper actuation lever 13c is rotated rearward and then is returned from the rearward rotated position to the original position, by the cam wheel 13a of the component stopper displacement mechanism 13 rotated a predetermined angle in the same direction as the ratchet wheel 12e.

When the route leading from the valley portion of the cam wheel 13a to the adjacent ridge portion in the clockwise direction is utilized and the stopper actuation lever 13c is rotated rearward, the component stopper 10 is displaced rearward by the urging force of the spring S1, as shown in FIG. 10, and then the end face of the component stopper 10 abuts the front end of the component take-out port 6b, thereby ensuring an expected component stopping position. That is, the chip components P in the longitudinal direction which are conveyed by the belt 8 are stopped and aligned without gaps at the position where the foremost chip component P abuts the component stopper 10. The foremost chip component P is attracted to the component stopper 10 by the magnetic force of the permanent magnet M. Also, since the forward movement quantity of the belt 8 per once is longer than the length of the chip component P, the belt 8 alone advances slightly after component stop, making use of the sliding between the component and the belt. Therefore, even if a gap occurred between chip components within the conveyor passage X, the gap could be quickly absorbed.

Also, when the stopper actuation lever 13c is returned utilizing the route leading from the ridge portion of the cam wheel 13a to the adjacent valley in the clockwise direction, the inner end of the component hold pin 13f is projected into the linear groove 6a by the rotational return of the pin actuation lever 13e to the original position and the second foremost chip component P is held, as shown in FIG. 7. At nearly the same time, the component stopper 10 is displaced forward and separated from the front end of the component take-out port 6b, and also the foremost chip component P attracted by the permanent magnet M is displaced forward with the component stopper 10 and is separated from the second chip component P. As a consequence, a space C is forcibly developed between the foremost chip component P and the second chip component P.

The operation of taking out the foremost chip component P by a suction nozzle or the like (not shown) is executed in the state where the component stopper 10 has been displaced forward and also the foremost chip component P has been separated completely from the second chip component P, as shown in FIG. 7. Therefore, even in the case where the foremost chip component P and the second chip component P have been stuck together or caught with each other, for example, by the influence of humidity, they are easily separated from each other and the foremost chip component P can be taken out in a stable posture without interfering with the second chip component P.

Thus, according to the chip component feeding apparatus described in FIGS. 1 to 10, the first and second take-in members 3 and 4 are relatively moved with respective flat faces held in face contact with each other. With the relative movement between the first and second take-in members 3 and 4, the prismatic chip components P stored in a bulk state within the storage chamber 2a can be taken in one by one into the vertical passage T provided between the take-in members 3 and 4, in such a posture that the chip component P is in the longitudinal direction thereof and that one of the two opposite widest faces of the chip component faces the first take-in member 3 and the other faces the second take-in member 4.

In the aforementioned take-in mechanism, the probability that the prismatic chip component P is taken into the vertical passage T in a predetermined posture is high. Therefore, occurrence of taken-in error can be prevented and prismatic chip component P can be taken-in downward one by one in the longitudinal posture with stability and efficiency.

Figure 11A:
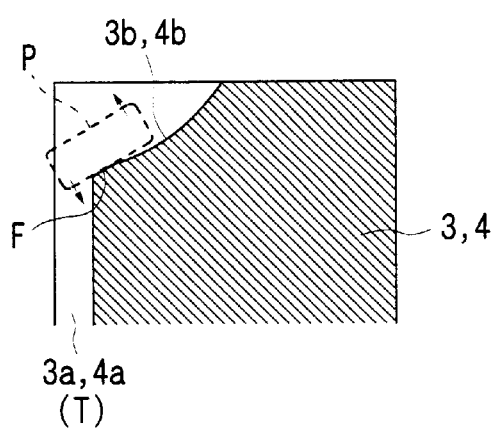
FIGS. 11(a) and 11(b) are partial sectional views of the take-in members showing a modification of shape of the guide way.
Figure 11B:
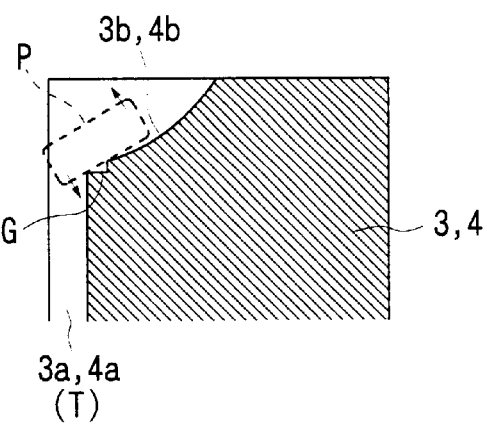

In the embodiment shown in FIGS. 1 to 10, while the guide ways 3b and 4b consisting of curved faces have been shown as examples, inclined face F such as that shown in FIG. 11(a) or gap G such as that shown in FIG. 11(b) may be provided in boundary portions between the guide way 3b, 4b and the take-in groove 3a, 4a in order to take the chip components P into the vertical passage T with a higher probability. When done like this, rotational force based on self-weights indicated by an allow in views is applied to the chip component P which attempts to stop at the boundary portion between the guide way and the groove, and consequently, that chip component P can be easily dropped into the vertical passage T. Of course, the aforementioned inclined face F and gap G may be provided partially or entirely on the boundary portion between the guide way and the groove.

Figure 12:
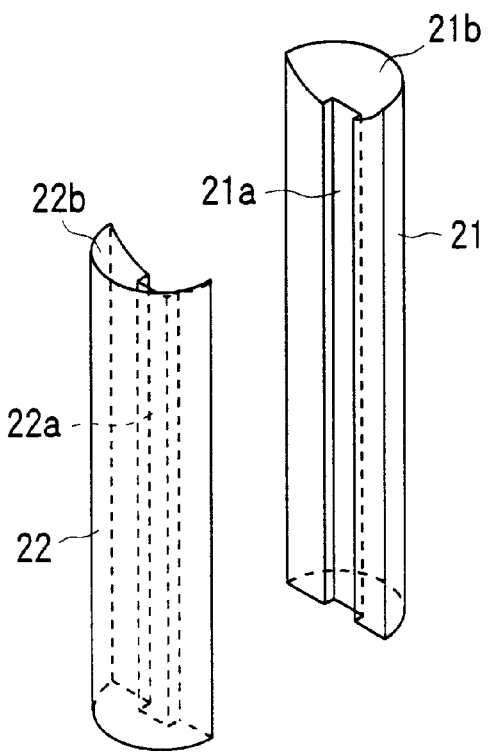
FIG. 12 is an exploded perspective view of the take-in members showing a modification of the take-in members.

Also, in the aforementioned embodiment shown in FIGS. 1 to 10, while the first and second take-in members 3 and 4 have been rectangular parallelepipeds, members having a semicircular shape in cross section and grooves 21a and 22a in respective flat faces may be employed as first and second take-in members 21 and 22, as shown in FIG. 12. In addition, as shown in the figure, if the maximum outlines of the guide ways 21b and 22b which are formed in the upper ends of the take-in members 21 and 22 are equal to those of the take-in members 21 and 22, flat portions can also be omitted from the upper ends of the take-in members 21 and 22. If done in this way, chip components P are prevented from staying on the upper ends of the take-in members 21 and 22 and also chip components being stored within the storage chamber 2a can be taken in to the very last chip component without waste.

Figure 13:
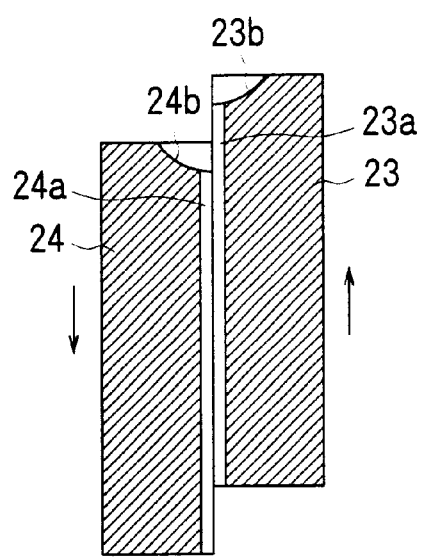
FIGS. 13(a) and 13(b) are vertical sectional views of the take-in members showing a modification of movement of the take-in members.
Figure 13:
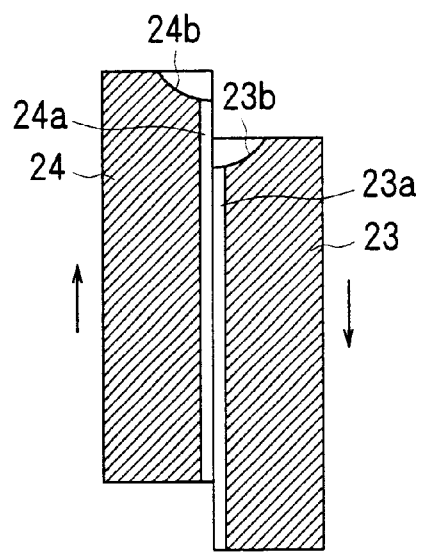

Furthermore, in the aforementioned embodiment shown in FIGS. 1 to 10, although only one take-in member 4 of the two take-in members has been moved up and down, the same component take-in operation as the aforementioned can be performed even when two take-in members 23 and 24 are alternately moved up and down, as shown in FIGS. 13(a) and 13(b). In order to alternately move the take-in members 23 and 24 up and down, a link mechanism for coupling them so that they are freely rotatable can be suitably utilized in the center between them as a mechanism for rotating them in opposite directions. In the figures, reference numerals 23a and 24a denote grooves formed in the contacting faces of the take-in members 23 and 24, respectively. Reference numerals 23b and 24b denote guide ways formed in the upper ends of the take-in members 23 and 24. If done like this, the up-and-down movements of the take-in members 23 and 24 can be reduced and therefore the height dimension of the apparatus can be reduced.

Figure 14:
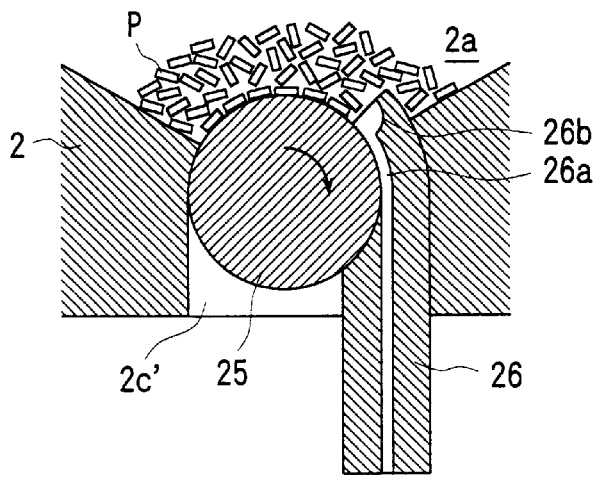
FIGS. 14(a) and 14(b) are a vertical sectional view and a perspective view respectively of the take-in members showing a modification of shape of the take-in members.
Figure 14:
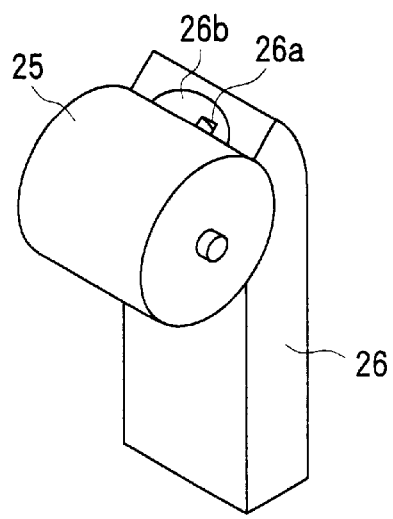

Moreover, in the aforementioned embodiment shown in FIGS. 1 to 10, although the first and second take-in members 3 and 4 have been rectangular parallelepipeds, one take-in member 25 may be a cylinder as shown in FIGS. 14(a) and 14(b). The take-in member 25 is formed with a circumferential groove 25a. The other take-in member 26 may be provided with a curved face having the same curvature as the circumferential face of the take-in member 25. A rectangular sectional shaped groove 26a is formed in the lateral center of the curved face, and a guide way 26b consisting of a curved face of about a quarter of a spherical face is formed in the end portion of the groove 26a.

The cylindrical take-in member 25 is disposed within the hole 2c' of the hopper 2 so that it can be freely rotated, and a portion of the circumference face is exposed to the storage chamber 2a. Also, the stationary take-in member 26 is disposed within the hole 2c so that the upper end is inserted into the storage chamber 2a and also the curved face is in face contact with the circumferential face of the take-in member 25. A similar ratchet mechanism as the belt driving mechanism 12 can be suitably utilized in order to rotate the rotatable take-in member 25 in a predetermined direction. The width of the groove 26a provided in the stationary take-in member 26 is slightly greater than the width dimension of the chip component P, and the depth of the groove 26a is slightly greater than the height of the chip component P. Although only the take-in groove 26a is shown, a vertical passage is formed in the take-in member 26 so that chip components P in the longitudinal direction are taken in one by one and moved downward by self-weight.

Figure 15:
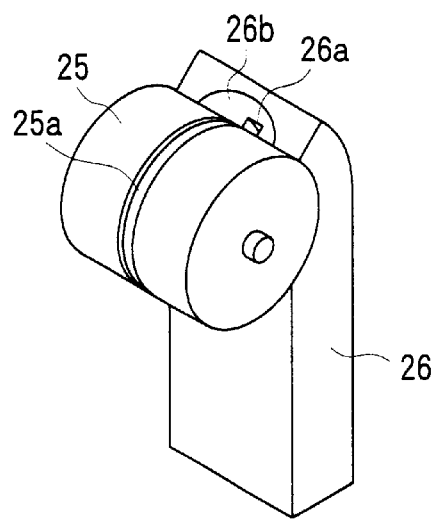
FIG. 15 is a perspective view of the take-in members showing another modification of shape of the take-in members.

In the structure described above, when the cylindrical take-in member 25 are rotated intermittently or continuously in the clockwise direction of FIG. 14(a), the chip components P in near face contact with the circumferential face of the take-in member 25 will be guided gradually to the center by the guide way 26b of the take-in member 26 which relatively rotates in the opposite direction. The direction of the guided chip component P is turned in the longitudinal direction thereof and taken into the vertical passage. The chip component P in the longitudinal direction is moved downward along the vertical passage by self-weight. That is, since chip components can be taken in by rotation of the take-in member 25, the height dimension of the apparatus can be reduced compared with the case where the take-in member is moved up and down. In addition, as shown in FIG. 15, if the aforementioned cylindrical take-in member 25 is formed with a rectangular sectional shaped circumferential groove 25a at the lateral center portion thereof, the direction of the chip component P which is taken into the vertical passage can be corrected by the circumferential groove 25a.

FIGS. 16 to 26 show a second embodiment of the present invention that is applied to a chip component feeding apparatus.

In the figures, reference numeral 101 denotes a frame, 102 a first spacer, 103 a second spacer, 104 a transparent plate, 105 an opening and closing lid, 106 a first take-in member, 107 a second take-in member, 108 a vertical pipe, 109 a pipe holder, 110 a component guide, 111 a belt guide, 112 a belt, 113 a pair of front and rear pulleys, 114 a component stopper, 115 a stopper support member, 116 a control lever, 117 a take-in member actuation lever, 118 a belt driving lever, 119 a relay lever, 120 a wheel actuation lever, 121 an ratchet, 122 a ratchet wheel, 123 a cam wheel, 124 a stopper actuation lever, 125 a pin actuation lever, and 126 a component hold pin.

Figure 16:
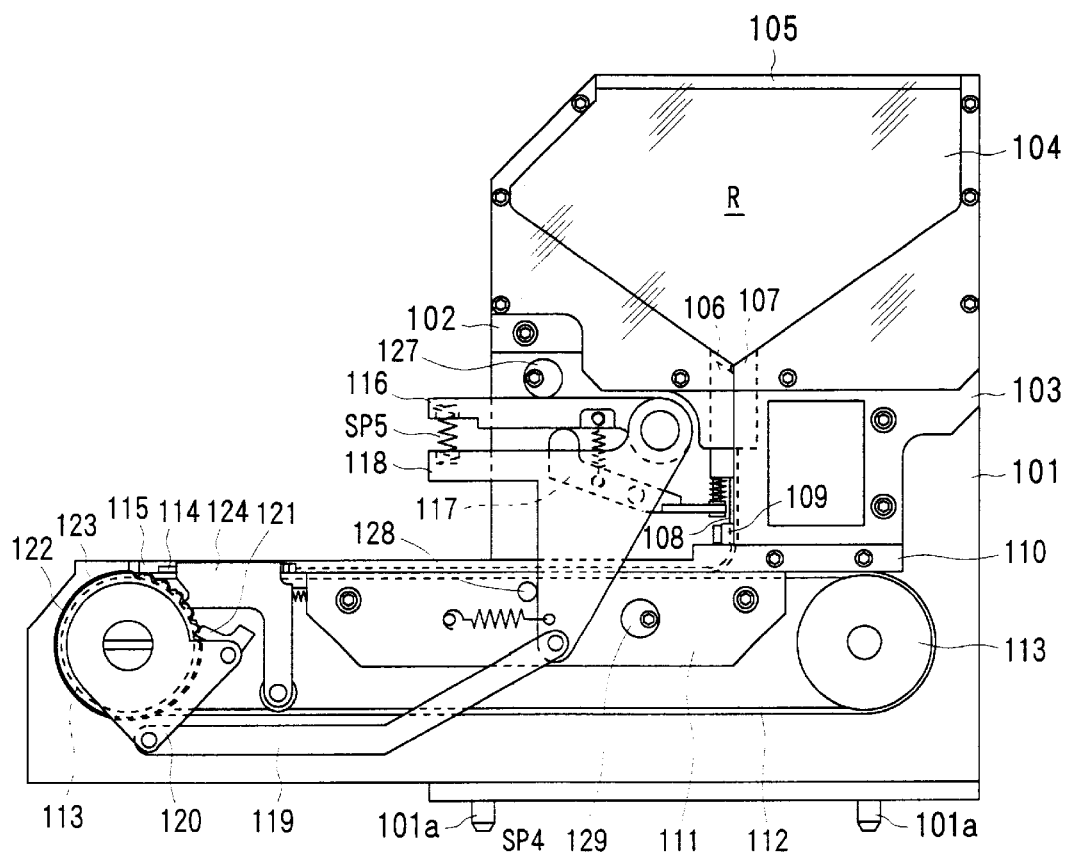
FIG. 16 is a side view showing a chip component feeding apparatus according to a second embodiment of the present invention.

The frame 101 fulfills a role of supporting constituent members to be described later. As shown in FIG. 16, on the lower face of the frame 101 there are provided two attaching pins 101a which are inserted into positioning holes provided in an outside apparatus (not shown).

The first and second spacers 102 and 103 are fixed to the frame 101 along with the transparent plate 104 covering the faces of the spacers. The space, surrounded by the frame 101, first spacer 102, second spacer 103, and transparent plate 104, forms a storage chamber R with a predetermined width. The vertical sectional shape of the storage chamber R forms a pentagon. Also, on the upper opening of the storage chamber R the opening and closing lid 105 is attached so that it can freely be opened and closed.

The aforementioned storage chamber R is stored a large number of prismatic chip components P in a bulk state. The chip components P consist of one kind, and have a relation of length>width>height such as that shown in FIG. 2(a). The chip components P are represented, for example, by chip capacitors, chip inductors, and chip resisters. The chip component P has external electrodes and internal conductors, and can be attracted by a permanent magnet M to be described later. The chip components P stored within the storage chamber R are moved downward along the bottom face inclination by self-weight when they are supplied. Of course, if the cross sectional shape of the vertical pipe 108 to be described later is changed, a chip component P with a relation of length>width=height such as that shown in FIG. 2(b) can also be taken in.

Figure 17:
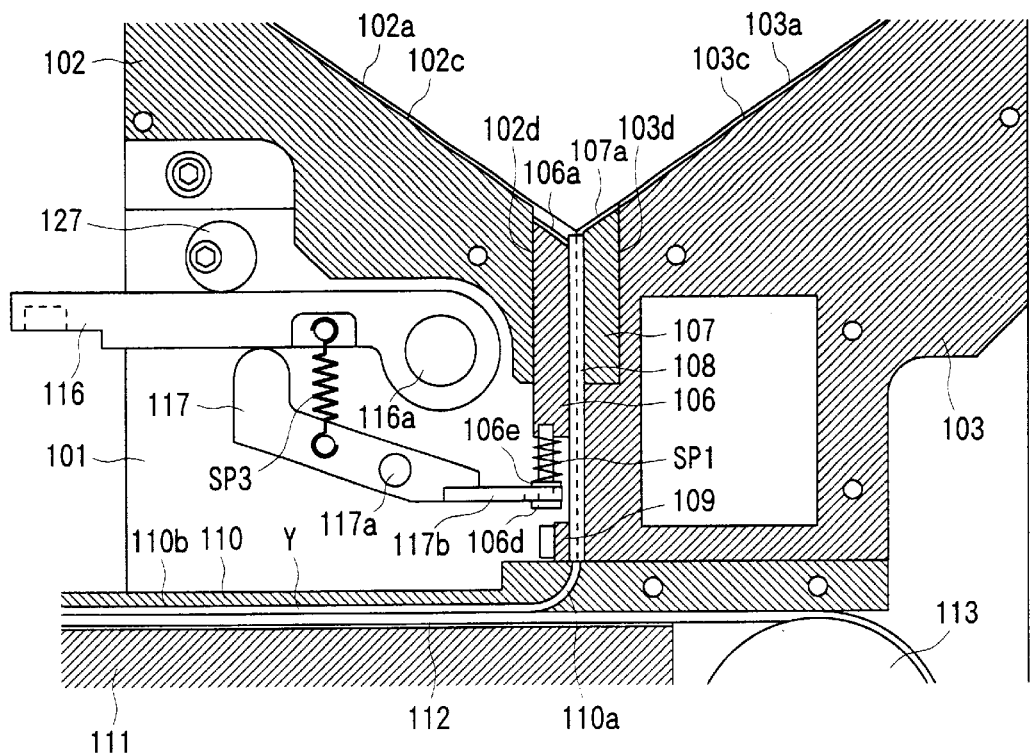
FIG. 17 is a partial enlarged vertical sectional view showing the chip component feeding apparatus shown in FIG. 16.
Figure 18:
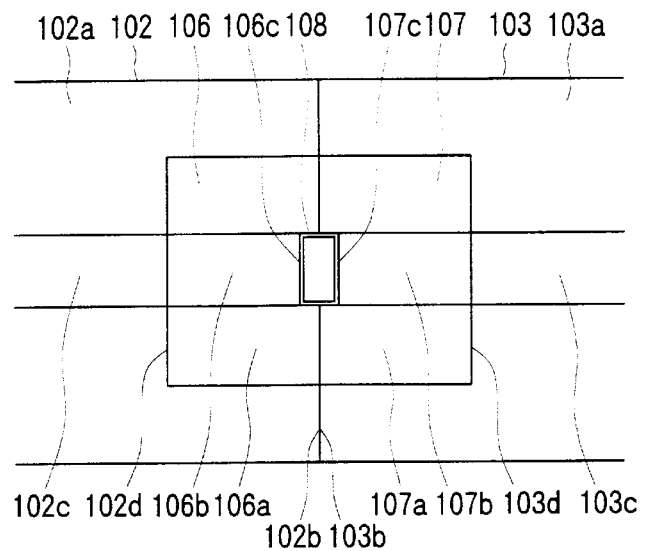
FIG. 18 is a partial enlarged top view showing the chip component feeding apparatus shown in FIG. 16.

The first spacer 102, as shown in FIGS. 17 and 18, is equipped with an inclined face 102a constituting the bottom face of the storage chamber R and a vertical face 102b extending from the inclined face 102a. The vertical face 102b abuts the vertical face 103b of the second spacer 103. Also, the center in the width direction of the inclined face 102a is formed with a rectangular sectional shaped groove 102c. The groove 102c has a width slightly greater than that of the chip component P and a depth slightly less than the height of the chip component P. Furthermore, the center in the width direction of the vertical face 102b is formed with a rectangular sectional shaped groove 102d, which houses the first take-in member 106 so that the member 106 can be moved up and down.

The second spacer 103, as shown in FIGS. 17 and 18, is equipped with an inclined face 103a constituting the bottom face of the storage chamber R and a vertical face 103b extending from the inclined face 103a. The vertical face 103b abuts the vertical face 102b of the first spacer 102. Also, the center in the width direction of the inclined face 103a is formed with a similar groove 103c as the guide groove 102c of the first spacer 102. Furthermore, the center in the width direction of the vertical face 103b is formed with a rectangular sectional shaped groove 103d, which houses the second take-in member 107 in a fixed state.

Figure 19:
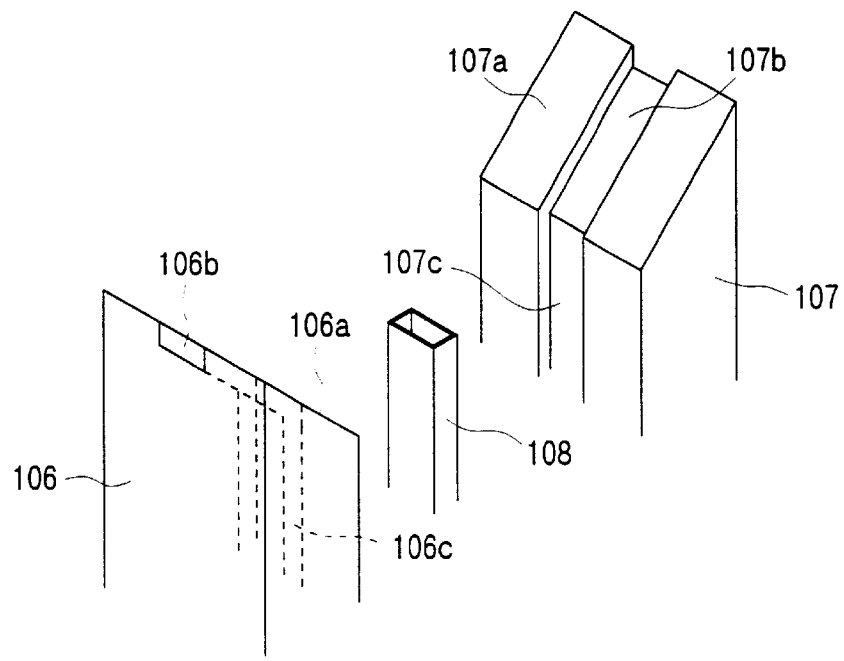
FIG. 19 is a partial exploded perspective view showing the take-in members and the pipe shown in FIG. 16.

The first take-in member 106, as shown in FIGS. 17 to 19, has a width and a thickness slightly less than those of the groove 102d of the first spacer 102 and is housed in the groove 102d so as to be movable up and down. Also, the upper end of the first take-in member 106 is formed with an inclined face 106a of the same angle as the inclined face 102a of the first spacer 102. Furthermore, the center in the width direction of the inclined face 106a is formed with a similar groove 106b as the guide groove 102c of the first spacer 102. The center in the width direction of the flat face of the first take-in member 106 in face contact with the second take-in member 107 is formed with a rectangular sectional shaped groove 106c. The groove 106c has a width slightly greater than that of the vertical pipe 108 and a depth equivalent to ½ of the thickness of the vertical pipe 108 and is continuous to the groove 106b at an angle. In the lower end of the first take-in member 106 a flanged control rod 106d is vertically mounted. The control rod 106d is provided with a washer 106e and a coil spring SP1. In the first take-in member 106, the upper inclined face 106a rises from a stand-by position lower than the inclined face 102a of the first spacer 102 to a position higher than the inclined face 102a of the first spacer 102, and falls from the rising position to the stand-by position. This operation is performed as one cycle.

The second take-in member 107, as shown in FIGS. 17 to 19, has a width and a thickness nearly equal to those of the groove 103d of the second spacer 103, and is housed in the groove 103d in a fixed state. Also, the upper end of the second take-in member 107 is formed with an inclined face 107a of the same angle as the inclined face 103a of the second spacer 103. Furthermore, the center in the width direction of the inclined face 107a is formed with a similar groove 107b as the guide groove 103c of the second spacer 103. The aforementioned inclined face 107a and groove 107b are continuous to the inclined face 103a and groove 103c of the second spacer 103 without a difference in level.

The center in the width direction of the flat face of the second take-in member 107 in face contact with the first take-in member 106 is formed with a rectangular sectional shaped groove 107c. The groove 107c has a width slightly greater than that of the vertical pipe 108 and a depth equivalent to ½ of the thickness of the vertical pipe 108 and is continuous to the groove 107b at an angle.

The grooves 106c and 107c formed in the first and second take-in members 106 and 107 constitute a vertical passage in the state where the two faces of the take-in members 106 and 107 are in face contact with each other. This vertical passage is employed to dispose the vertical pipe 108, and the cross sectional shape is similar to that of the vertical pipe 108.

In the illustrated example, the second take-in member 107 and the second spacer 103 have been separately constituted, however, in the case where the second spacer 103 is formed from metal having an excellent wear resisting property, the second take-in member 107 may be formed integrally with the second spacer 103 to omit the second take-in member 107.

The vertical pipe 108 consists of a square pipe material with a thickness less than the thickness of chip component P. As shown in FIGS. 17 to 19, the vertical pipe 108 is inserted into the passage formed by the mutual contacting faces of the first and second take-in members 106 and 107, and the lower end portion is fixed to the second spacer 103 by the pipe holder 109 (see FIG. 20). The vertical pipe 108 has a length such that the lower end abuts the component guide 110 and also the upper end becomes slightly lower than the boundary line between the grooves 107b and 107c of the second take-in member 107. The vertical pipe 108 also has a square interior hole similar to the end face shape of chip component P. In the vertical pipe 108 of the illustrated example, prismatic chip components P can be taken in one by one in such a manner that the direction of the chip component P is turned in the longitudinal direction thereof and also one of the two widest faces the first take-in member 106 and the other faces the second take-in member 107. The chip component P taken into the vertical pipe 108 is moved downward along the vertical pipe 108 by self-weight. When the upper end of the interior hole of the vertical pipe 108 is chamfered or rounded (see FIG. 11), chip components P can be smoothly taken into the vertical pipe 108.

Figure 20:
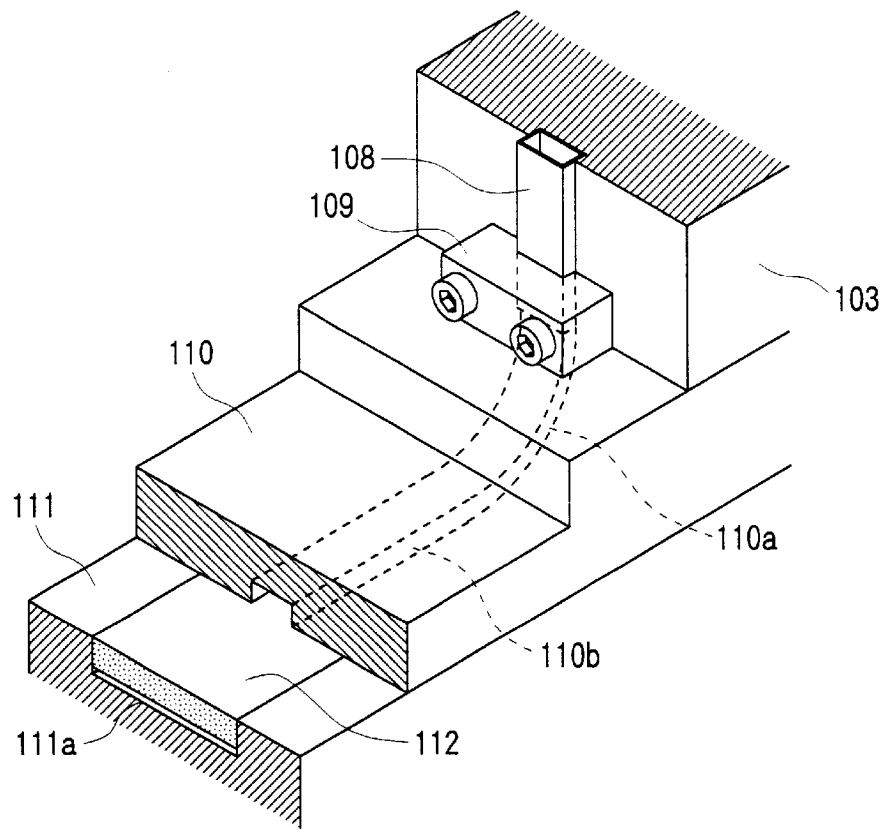
FIG. 20 is a partial-perspective view showing the positional relationship of the pipe, component guide, and belt guide shown in FIG. 16.
Figure 22:
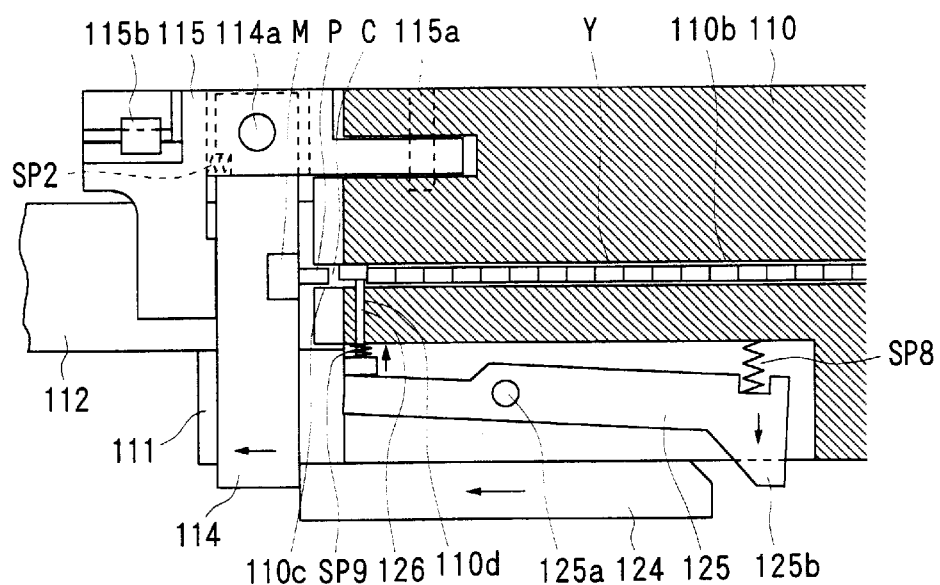
FIG. 22 is a partial enlarged top view, partly broken away, showing the chip component feeding apparatus shown in FIG. 16.

The component guide 110, as shown in FIGS. 17, 20, and 22, is on the upper side of the belt 112. The component guide 110 is fixed to the frame 101 so that it contacts the lower face of the second spacer 103. This component guide 110 has an interior curved passage 110a, which is continuous to the lower opening of the aforementioned vertical pipe 108 and has a predetermined curvature at the passage center. The lower face of the component guide 110 has a rectangular sectional shaped linear groove 110b, which is continuous to the curved passage 110a without a difference in level. This curved passage 110a has an angle range of a little under 90 degree when viewed from the side face, and the cross sectional shape is nearly equal to or slightly larger than that of the vertical pipe 108. That is, in the curved passage 110a, the chip component P from the vertical pipe 108 can be moved downward by self-weight, and the vertical posture of the chip component P can be changed to a nearly transverse posture when passed through the curved passage 110a. Also, the portion of the curved passage 110a near the belt 112 is cut out in parallel to the belt surface so that the chip component P can be smoothly discharged from the curved passage 110a to the belt 112.

On the other hand, the opening of the linear groove 110b is closed by the upper face of the belt 112, thereby forming a conveyor passage Y along which chip component P are guided. The cross sectional shape of the conveyor passage Y is nearly identical with that of the curved passage 110a, and along the conveyor passage Y, the chip components P from the curved passage 110a can be conveyed forward in the longitudinally aligned state according to movement of the belt 112. Also, in front of the front end of the linear groove 110b, a component take-out port 110c is formed for taking out the foremost chip component P to the outside. Furthermore, in the front side face of the linear groove 110b, a hole 110d is formed for inserting a component hold pin 126 to be described later.

The belt guide 111, as shown in FIGS. 17, 20, and 22, is on the lower side of the belt 112, and the side face is fixed to the frame 101. The belt guide 111 has a linear groove 111a in the upper face, and the linear groove 111a has a width and depth slightly greater than the width and thickness of the belt 112. The center in the width direction of the linear groove 111a is aligned with that of the linear groove 110b of the component guide 110.

The belt 112, as shown in FIGS. 16, 17, and 20 to 22, comprises a non-magnetic and endless flat belt or timing belt formed from synthetic rubber or flexible resin. This belt 112 is wound on a pair of pulleys 113 supported by the frame 101 at the front and rear positions of the belt guide 111 so that the belt can be freely rotated. The lower face of the belt 112 is positioned within the linear groove 111a of the belt guide 111, while the upper face of the belt 112 is contacted with the lower face of the component guide 110 by the winding tension of the belt 112 so that the belt is movable back and forth.

Figure 21:
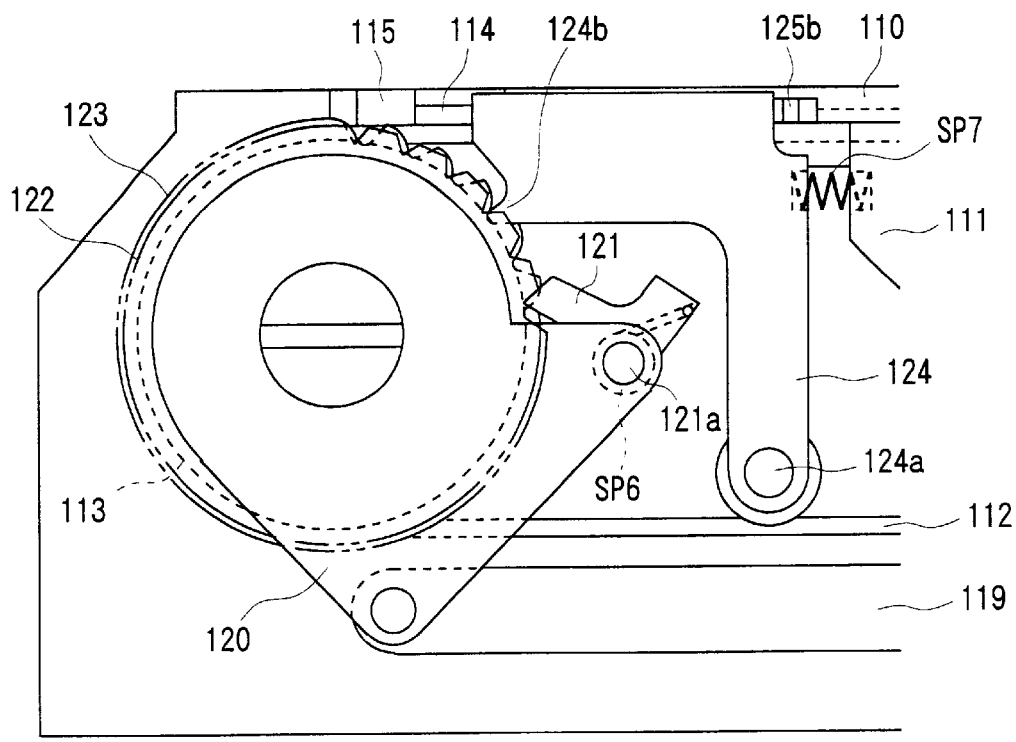
FIG. 21 is a partial enlarged side view showing the chip component feeding apparatus shown in FIG. 16.

The component stopper 114, as shown in FIGS. 16, 21 and 22, comprises a non-magnetic rectangular plate with the same thickness as the depth of the linear groove 110b of the component guide 110. This component stopper 114 is supported at one end thereof by a stopper support member 115 through a pin 114a and is rotatable parallel to the belt surface at the front side position of the linear groove 110b. Also, the component stopper 114 is urged in a counterclockwise direction in FIG. 22 by a coil spring SP2 tensioned between the stopper 114 and the stopper support member 115. The component stopper 114 ensures an expected component stopping position when one face thereof abuts the front end of the component take-out port 110c (see FIG. 26). Furthermore, at the position at which the component stopper 114 faces the foremost chip component P, a rare earth permanent magnet M in the form of a rectangular parallelepiped is provided so that either the N pole or the S pole contacts the foremost chip component P. In the illustration example, while the height of permanent magnet M is nearly equal to the thickness of the component stopper 114 and the width is greater than that of the chip component P, the height of permanent magnet M may be less than the thickness of the component stopper 114 and the width may also be less than that of the chip component P.

The stopper support member 115, as shown in FIGS. 16, 21, and 22, is attached at one end thereof to the front portion of the component guide 110 through a pin 115a so as to be freely rotatable. The stopper support member 115 engages a plate spring 115b provided on the front end of the component guide 110, thereby holding the component stopper 114 in a state parallel to the belt surface. Also, when the stopper support member 115 is disengaged from the plate spring 115b and is rotated upward along with the component stopper 114, the component stopper 114 is separated from the belt 112. With the upward rotation of the component stopper 114, the chip component P within the conveyor passage Y can be exhausted from the front end to the outside.

The control lever 116, as shown in FIGS. 16 and 17, is supported by the frame 101 through a pin 116a so that the control lever 116 can be freely rotated. Thus, the control lever 116 is rotatable up and down. The return position of the control lever 116 is prescribed by a stopper 127 provided in the frame 101.

The take-in member actuation lever 117, as shown in FIGS. 16 and 17, is provided under the control lever 116. The take-in member actuation lever 117 is supported by the frame 101 through a pin 117a so that the lever 117 can be freely rotated. Thus, the take-in member actuation lever 117 is rotatable up and down. The take-in member actuation lever 117 is urged in a clockwise direction in FIG. 17 by a coil spring SP3 tensioned between it and the control lever 116, and one end of the actuation lever 117 abuts the lower face of the control lever 116. The control lever 116 is also urged in the clockwise direction by the pushing force of the take-in member actuation lever 117, and the upper face of the control lever 116 abuts the stopper 127. Also, the rear end of the take-in member actuation lever 117 is provided with an engaging portion 117b having a rectangular sectional shaped cutout. The engaging portion 117b is inserted between the head portion of the control rod 106d and washer 106e of the first take-in member 106 through the cutout of the portion 117.

In the illustrated example, the aforementioned control lever 116 and take-in member actuation lever 117 constitute a take-in member up-and-down moving mechanism for vertically moving the first take-in member 106 a predetermined stroke.

The belt driving lever 118, as shown in FIG. 16, is supported by the frame 101 through the pin 116a common to the control lever 116 so that the mechanism 118 can be freely rotated up and down. This belt driving lever 118 is urged in a clockwise direction in FIG. 16 by a coil spring SP4 tensioned between it and the belt guide 111. One end of the belt driving lever 118 abuts a stopper 128, thereby prescribing the return position of the belt driving lever 118. Also, the position at which the rotation of the belt driving lever 118 is limited is prescribed by a stopper 129 provided in the belt guide 111.

The belt driving lever 118 and the control lever 116 are opposed to each other at the respective control end portions through a coil spring SP5. Therefore, when downward force is applied to the end portion of the control lever 116, this force can be transmitted to the end portion of the belt driving lever 118 through the coil spring SP5.

The stopper 127 of the control lever 116 is constituted by a circular plate and a screw for fixing the circular plate at an eccentric position. By changing the direction of the circular plate, the return position of the control lever 116 can be finely adjusted. Likewise, the stopper 129 of the belt driving lever 118 is constituted by a circular plate and a screw for fixing the circular plate at an eccentric position. By changing the direction of the circular plate, the rotation limiting position of the belt driving lever 118 can be finely adjusted. For example, when the direction of the circular plate of the stopper 127 is changed to lower so that the return position of the control lever 116 is lower than the position shown in FIG. 16, the stand-by position (lowering position) of the first take-in member 106 can be changed upward. Also, if the direction of the circular plate of the stopper 129 is changed to shift the rotation limiting position of the belt driving lever 118 to the right side of the position shown in FIG. 16, a belt feed quantity to be described later can be increased.

The wheel actuation lever 120, as shown in FIGS. 16 and 21, is supported on the shaft of the front pulley 113 so that it is freely rotatable. The wheel actuation lever 120 is connected to the aforementioned belt lever 118 through the relay lever 119.

The ratchet 121, as shown in FIGS. 16 and 21, is supported on the wheel actuation lever 120 through a pin 121a so that the ratchet 121 is freely rotatable. The ratchet 121 is urged in a counterclockwise direction in FIG. 21 by a coil spring SP6 mounted on the pin 121a, and in the stand-by position, the outer end of the ratchet 121 engages one of the valley portions of the ratchet wheel 122.

The ratchet wheel 122, as shown in FIGS. 16 and 21, is fixed on the front pulley 113 or coaxially on the shaft of the front pulley 113 so that it can be rotated with the front pulley 113. Also, on the circumference of the ratchet wheel 122, valley portions and ridge portions are alternately provided at intervals of a predetermined angle pitch.

In the illustrated example, the aforementioned belt driving lever 118, relay lever 119, wheel actuation lever 120, ratchet 121, and ratchet wheel 122 as a whole constitute a belt driving mechanism which intermittently rotates the front pulley 113 at a predetermined angle.

The cam wheel 123, as shown in FIGS. 16 and 21, is fixed on the front pulley 113 or coaxially on the shaft of the front pulley 113 so that it can be rotated with the front pulley 113. On the circumference of the cam wheel 123, valley portions and ridge portions are alternately provided at intervals of the same angle pitch as the aforementioned ratchet wheel 122.

The stopper actuation lever 124, as shown in FIGS. 16, 21 and 22, is supported on the frame 101 through a pin 124a so that it can be freely rotatable. This stopper actuation lever 124 is rotatable in an up-and-down direction. The stopper actuation lever 124 is urged in a counterclockwise direction in FIG. 21 by a coil spring SP7 tensioned between it and the belt guide 111. At the stand-by position, the actuating protrusion 124b of the stopper actuation lever 124 engages one of the valley portions of the cam wheel 123, and consequently, the component stopper 114 is moved forward and held at a component take-out positions away from the front end of the component guide 110 (see FIG. 22).

The pin actuation lever 125, as shown in FIGS. 21 and 22, is attached to the front portion of the component guide 110 through a pin 125a so that it can be freely rotated. The pin actuation lever 125 is rotatable parallel to the face of the belt 112. The pin actuation lever 125 is urged in a clockwise direction in FIG. 22 by a coil spring SP8 tensioned between it and the component guide 110. The pin actuation lever 125 has one end which abuts the component hold pin 126, and at the stand-by position, the actuating protrusion 125b provided on the other end protrudes from the side face of the component guide 110.

The component hold pin 126, as shown in FIG. 22, is inserted in a through hole 110e of the component guide 110 through a coil spring SP9 so that the pin 126 is movable. A force relation of SP9<SP8 has been set to the coil springs SP8 and SP9. Therefore, at the stand-by position at which the pin actuation lever 125 is not pushed by the stopper actuation lever 124, the component hold pin 126 is projected into the guide groove 110b by the pushing force of the pin actuation lever 125 and pushes the chip component P against the guide groove 110b, thereby holding the chip component P (see FIG. 22).

In the illustrated example, the aforementioned cam wheel 123, stopper actuation lever 124, pin actuation lever 125, and component hold pin 126 as a whole constitute a component stopper displacement mechanism. The component stopper displacement mechanism rotates the component stopper 114 between the component take-out position and the component stopping position, and projects the component hold pin 126 into the guide groove 110b when the component stopper 114 is at the component take-out position.

The description is now provided of the operation of the aforementioned chip component feeding apparatus.

Figure 23:
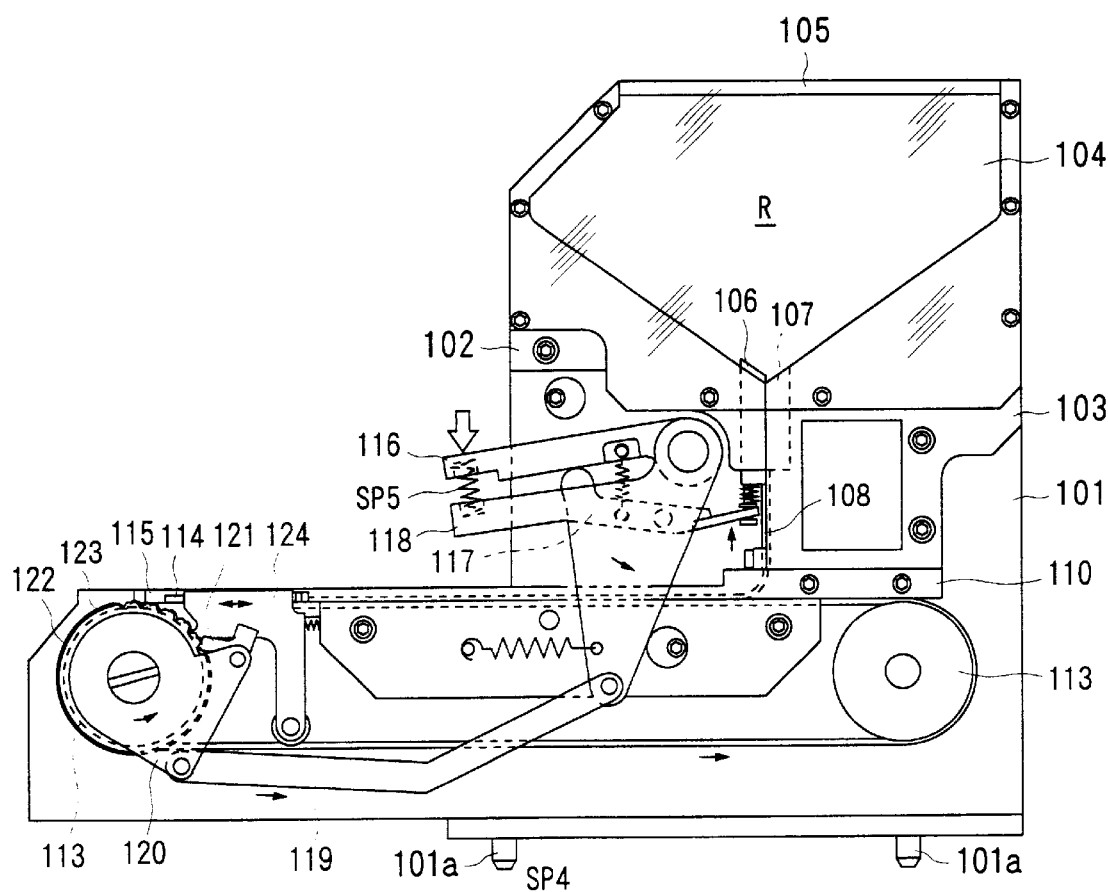
FIG. 23 is an operational explanatory view corresponding to FIG. 16.
Figure 25:
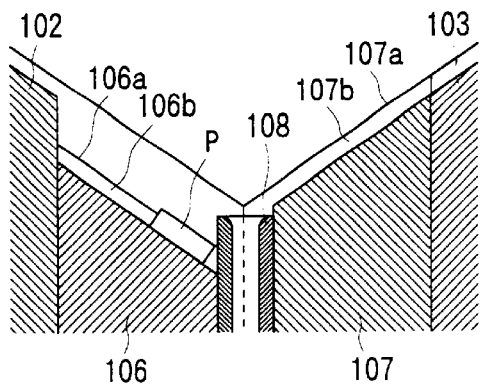
FIGS. 25(a) to 25(e) are an explanatory views showing components take-in action.
Figure 25:
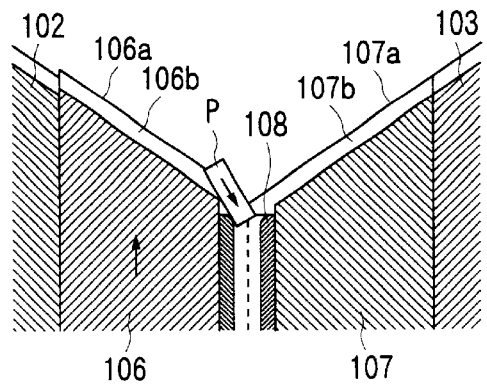
Figure 25:
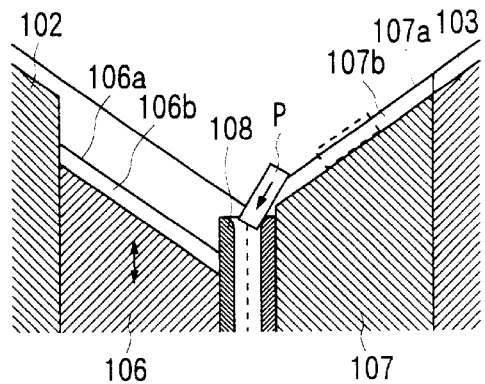
Figure 25:
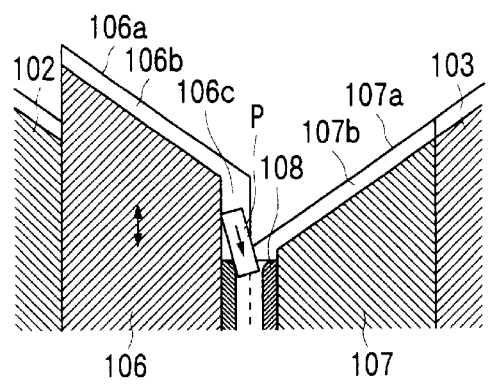

When the foremost chip component P is taken out of the component take-out port 110c by an suction nozzle or the like (not shown), the end portion of the control lever 116 is pushed downward by a portion of the suction nozzle or another drive unit as shown by a white arrow in FIG. 23.

In the state where the first take-in member 106 is at its lowering position, the upper end inclined face 106a of the first take-in member 106 is at a lower position than the upper end inclined face 107b of the second take-in member 107, as shown in FIG. 24(a). At this time, a small quantity of chip components P is taken into the stepped portion between the take-in members 106 and 107.

Now, when the end portion of the control lever 116 is pushed downward, the take-in member actuation lever 117 is rotated. By the rotation of the take-in member actuation lever 117, the first take-in member 106 is raised by a predetermined stroke from the lowering position along the groove 102d of the first spacer 102, in the state where the first take-in member 106 is in face contact with the second take-in member 107. As shown in FIG. 24(b), the upper end inclined face 106a of the first take-in member 106 projects above the inclined face 102a of the first spacer 102 and is slightly inserted into the storage chamber R. When the pushing force applied to the end portion of the control lever 116 is released, the take-in member actuation lever 117 is returned to the original position. Consequently, the first take-in member 106 is lowered by a predetermined stroke from the rising position and is returned to the position of FIG. 24(a).

In the process where the first take-in member 106 is moved from the lowering position to the rising position, the chip components P within the stepped portion are lifted upward and the chip components within the storage chamber 2 are subjected to a disentangling operation, by the first take-in member 106. Also, in the process where the first take-in member 106 is moved from the rising position to the lowering position, the entire stored chip components go down by the falling of the first take-in member 106, and a small quantity of chip components P are again taken into the stepped portion between the first take-in member 106 and second take-in member 107.

In the process where the first take-in member 106 rises or falls, the chip components P within the stepped portion or chip components P existing near the upper ends of the take-in members 106 and 107 take various positions. However, some chip components are taken into the upper end grooves 106b of the take-in member 106 and 107b of the take-in member 107 in an appropriate posture where one of the two widest faces is in contact with the bottom face of the groove 106b and 107b. Also, some chip components P are taken into the groove 106c of the raised first take-in member 106 in a same appropriate posture.

That is, as shown in FIG. 25(a), when chip component P is positioned in an appropriate posture within the upper end groove 106b of the first take-in member 106 located in the lowering position, the chip component P falls into the upper end opening of the vertical pipe 108 and is taken into the vertical pipe 108, while guided by the groove 106b, in the process where the first take-in member 106 rises, as shown in FIG. 25(b).

Also, as shown in FIG. 25(c), when chip component P is positioned within the upper end groove 107b of the second take-in member 107 in an appropriate posture, the chip component P falls into the upper end opening of the vertical pipe 108 and is taken into the vertical pipe 108, while guided by the groove 107b, in the process where the first take-in member 106 rises or falls.

Furthermore, as shown in FIG. 25(d), when chip component P is positioned within the vertical groove 106c of the first take-in member 106 located in the rising position in an appropriate posture, the chip component P falls into the upper end opening of the vertical pipe 108 and is taken into the vertical pipe 108, while guided by the vertical groove 106c, in the process where the first take-in member 106 falls.

It is a matter of course that the chip component P can be taken into the vertical pipe 108 one by one at timing different from the aforementioned. Even in either case, prismatic chip component P is taken into the vertical pipe 108 one by one in such a posture that the chip component P is in the longitudinal direction thereof and that one of the two opposite widest faces of the chip component faces the first take-in member 106 and the other faces the second take-in member 107.

The chip components P in the longitudinal direction, taken into the vertical pipe 108 in the aforementioned way, are moved downward along the vertical pipe 108 by self-weight in that posture and go into the curved passage 110a, as shown in FIG. 24(b). The chip components P within the curved passage 110a are moved downward along the curved passage 110a by self-weight according to the curvature of the curved passage 110a, and the vertical posture is changed to a nearly transverse posture. The foremost chip component P, passes through the curved passage 110a, abuts the face of the belt 112 at the front end thereof, and the following chip components Pare aligned in the longitudinal direction behind the foremost chip component.

On the other hand, when the end portion of the control lever 116 is pushed downward, the pushing force is also applied to the belt driving lever 118 on the lower side. Next, the relay lever 119 is rotated in the counterclockwise direction in FIG. 23 and therefore the wheel actuation lever 120 is rotated counterclockwise. Next, the ratchet wheel 122 engaged by the ratchet 121 is rotated in the same direction along with the front pulley 113, and the belt 112 is moved forward a distance corresponding to the rotated angle. More particularly, the belt 112 is moved only a longer distance than the length of the chip component P. When the pushing force applied to the end portion of the control lever 116 is released, the belt driving lever 118, relay lever 119, and wheel actuation lever 120 is returned to the respective original positions without rotating the ratchet wheel 122 in the opposite direction.

In the process where the belt 112 is moved forward a predetermined distance, the chip component P with the front end abutting the belt surface is pulled out forward by the frictional resistance between it and the belt 112 and lies on the belt 112, as shown in FIG. 24(b), and the front end of the next chip component P abuts the belt surface.

The intermittent movement of the belt 112 is repeated each time the control lever 116 is pushed, that is, each time the foremost chip component P is taken out of the component take-out port 110c, and consequently, the chip components P aligned within the curved passage 110a are taken out forward in sequence. With this, chip components P are aligned, while they are subjected to an alignment operation by the linear groove 110b of the component guide 110. The chip components P in the aligned state are conveyed forward in correspondence with the intermittent movement of the belt 112.

On the other hand, when the front pulley 113 is rotated a predetermined angle simultaneously with the intermittent movement of the belt 112, the cam wheel 123 is rotated in the same direction with the front pulley 113. The undulation of the valley and ridge portions of the cam wheel 123 causes the stopper actuation lever 124 to rotate rearward and to return from the rearward rotated position to the original position. With this, the actuating protrusion 124b of the stopper actuation lever 124 engages the valley portion of the cam wheel 123 again.

Figure 26:
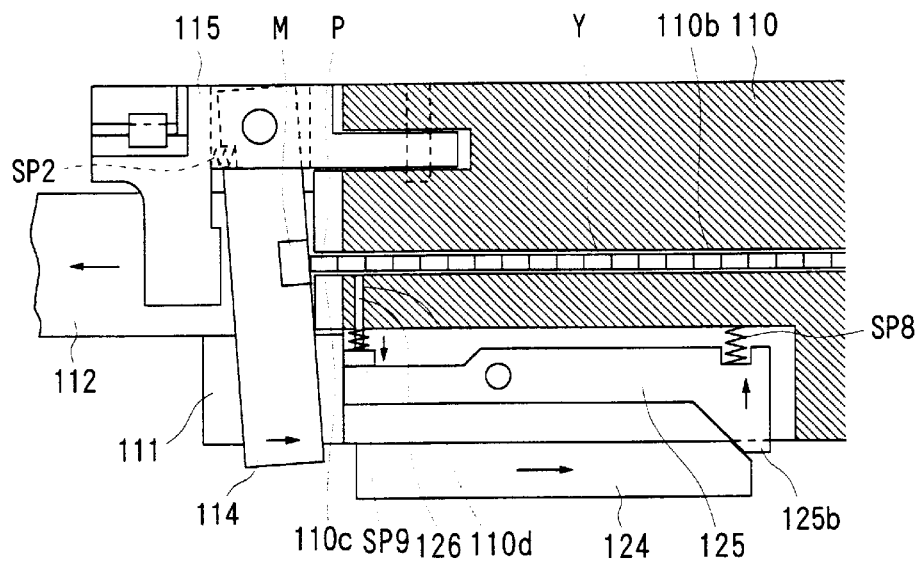
FIG. 26 is an operational explanatory view corresponding to FIG. 22.

When the stopper actuation lever 124 is rotated rearward by the route leading from the valley portion of the cam wheel 123 to the adjacent ridge portion in the clockwise direction, the actuating protrusion 125b of the pin actuation lever 125 is pushed inward by the rearward rotation of the stopper actuation lever 124, as shown in FIG. 26. The pin actuation lever 125 is rotated in the counterclockwise direction, and consequently, the component hold pin 126 is pulled out of the hole 110d by the urging force of the coil spring SP9.

At the same time, the pressing force of the stopper actuation lever 124 is released from the component stopper 114. Therefore, the component stopper 114 is displaced rearward by the urging force of the spring SP2 and then the rear face of the component stopper 114 abuts the front end of the component take-out port 110c, thereby ensuring an expected component stopping position. That is, the chip components P conveyed by the belt 112 are stopped and aligned in the longitudinal direction without gaps at the position where the foremost chip component P abuts the component stopper 114. The foremost chip component P is attracted to the component stopper 114 by the magnetic force of the permanent magnet M. Also, since the forward movement quantity of the belt 112 per once is longer than the length of the chip component P, the belt 112 alone advances slightly after component stop, making use of the sliding between the component and the belt. Therefore, even if a gap occurs between chip components within the conveyor passage Y, the gap can be quickly absorbed.

Also, when the stopper actuation lever 124 is returned utilizing the route leading from the ridge portion of the cam wheel 123 to the adjacent valley portion in the clockwise direction, the pushing force of the stopper actuation lever 124 is released from the pin actuation lever 125, as shown in FIG. 22. The pin actuation lever 125 is rotated in the clockwise direction by the urging force of the coil spring SP8. The rotated pin actuation lever 125 causes the inner end of the component hold pin 126 to project into the linear groove 110b, and the second chip component P in that position is pressed against the inner face of the linear groove 110b and is held.

Nearly at the same time, the component stopper 114 is displaced forward and separated from the front end of the component take-out port 110c by the pushing force of the stopper actuation lever 124, and also the foremost chip component P attracted by the permanent magnet M is displaced forward with the component stopper 114 and is separated from the second chip component P. Consequently, a space C is forcibly developed between the foremost chip component P and the second chip component P.

The operation of taking out the foremost chip component P by a suction nozzle or the like (not shown) is executed in the state where the component stopper 114 is displaced forward and also the foremost chip component P is separated completely from the second chip component P, as shown in FIG. 22. Therefore, even in the case where the foremost chip component P and the second chip component P is stuck together or caught with each other, for example, by the influence of humidity, they are easily separated from each other and the foremost chip component P can be taken out in a stable posture without interfering with the second chip component P.

Thus, according to the chip component feeding apparatus described in FIGS. 16 to 26, the first take-in member 106 and second take-in member 107 are relatively moved with respective flat faces held in face contact with each other. With the relative movement between the first take-in member 106 and second take-in member 107, the prismatic chip components P stored in a bulk state within the storage chamber R can be taken in one by one into the vertical pipe 108 disposed in the vertical passage between the take-in members 106 and 107, in such a posture that the chip component P is in the longitudinal direction thereof and that one of the two opposite widest faces of the chip component faces the second take-in member 107 and the other faces the first take-in member 106.

In the aforementioned take-in mechanism, the probability that the prismatic chip component P is taken into the vertical pipe 108 in a predetermined posture is high. Therefore, an error in the take-in operation can be prevented, and prismatic chip components P can be taken in and guided downward one by one in the longitudinal posture with stability and efficiency.

In the embodiment shown in FIGS. 16 to 26, although the first take-in member 106 has been moved up and down along the groove 102d of the first spacer 102, the first take-in member 106 may be moved up and down, while applying microvibration to the member in the width direction. In such a case, chip components P can be prevented from staying on the first take-in member 106 and taken into the vertical pipe 108 more efficiently.

Figure 27A:
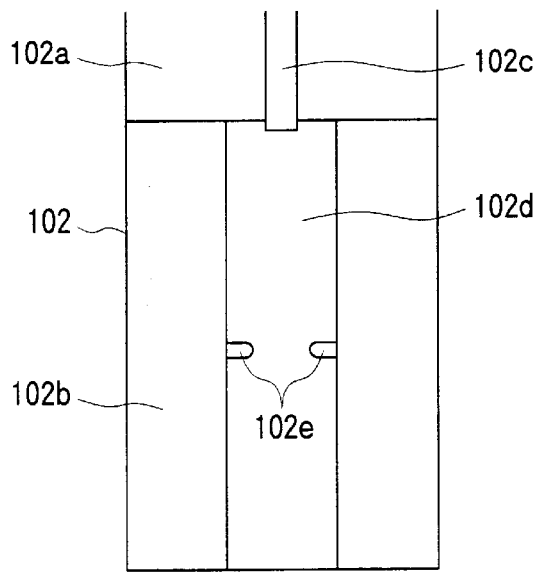
FIG. 27(a) is a front view of the spacer showing a vibration application mechanism.
Figure 27B:
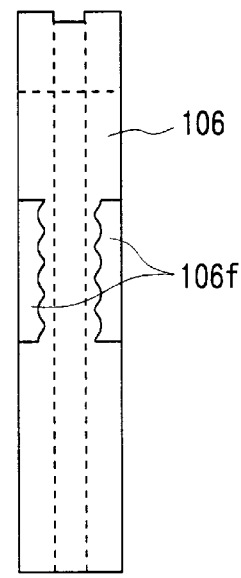
FIG. 27(b) is a rear view showing the take-in member of the vibration application mechanism.
Figure 28A:
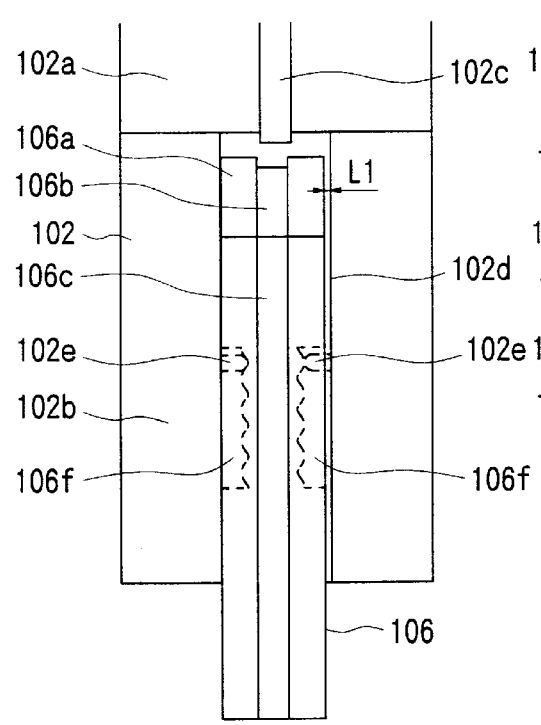
FIGS. 28(a) and 28(b) are operational explanatory views showing the vibration application mechanism shown in FIGS. 27(a) and 27 (b)

FIGS. 27 and 28 show an example of a vibration application mechanism. As shown in FIG. 27(a), the width of the groove 102d of the first spacer 102 is increased by a quantity of vibration (2×L1 in FIG. 28(a)), and a pair of opposed protrusions 102e are provided on the interior face of the groove 102d. Also, as shown in FIG. 27(b), the back face of the first take-in member 106 is provided with a pair of opposed corrugated recesses (i.e., opposed recesses with corrugated faces) 106f, which in turn slide on the opposed protrusions 102e.

When the aforementioned first take-in member 106 is moved upward along the groove 102d of the first spacer 102 from the lowering position of FIG. 28(a), the first take-in member 106 is displaced right and left when the corrugate face of the corrugated recess 106f slides on the protrusion 102e. That is, the first take-in member 106 is moved along a locus such as that indicated by an arrow in FIG. 28(b), thereby applying microvibration to the first take-in member 106. Of course, same microvibration can be applied when the first take-in member 106 falls. When the aforementioned dimension of L1 is set to less than the height of the chip component P, there is no possibility that the chip component P will be fitted into a gap corresponding to L1.

Figure 28B:
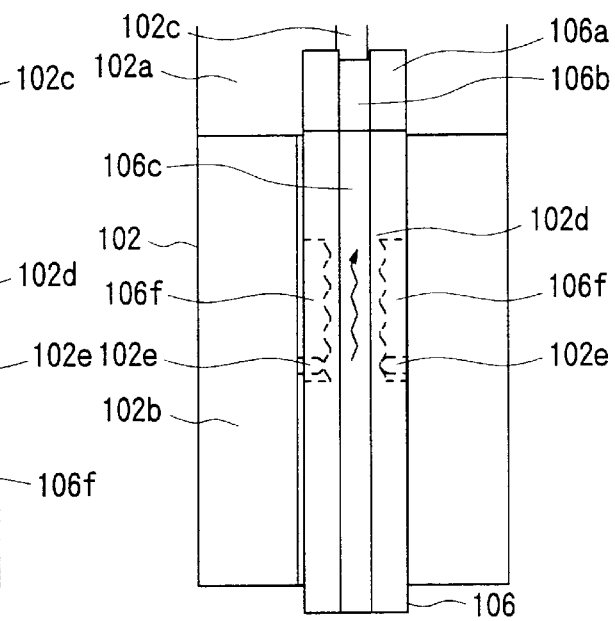
Figure 29:
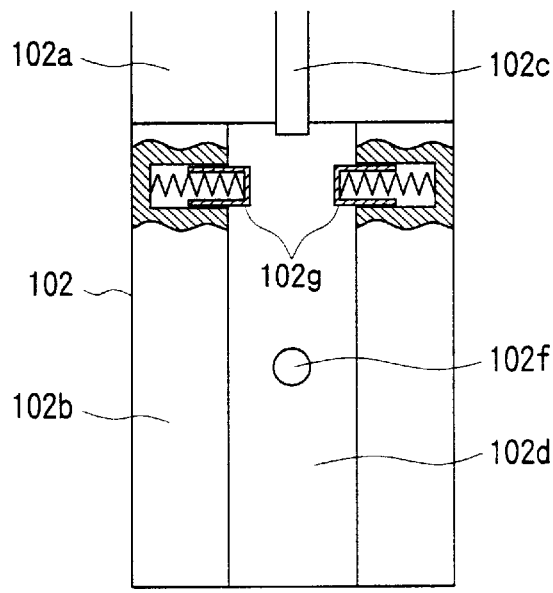
FIGS. 29(a) and 29(b) are a front view showing the spacer and a rear view showing the take-in members of another vibration application mechanism.
Figure 29:
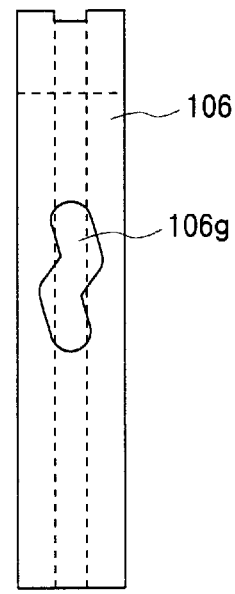
Figure 30:
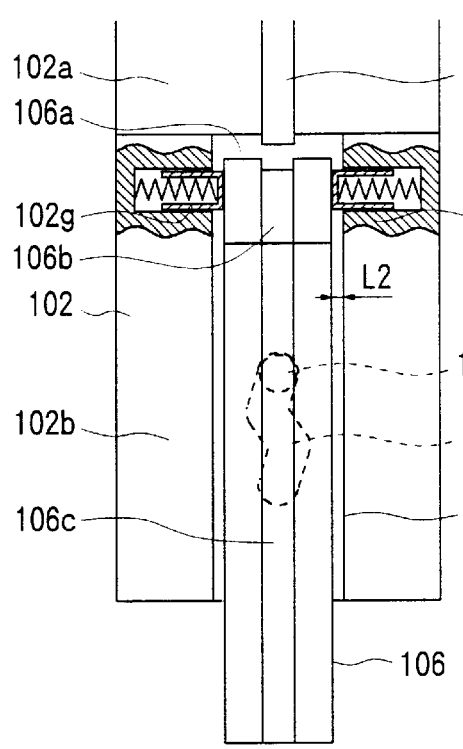
FIGS. 30(a) and 30(b) are operational explanatory views showing the vibration application mechanism of FIGS. 29(a) and 29(b)
Figure 30:
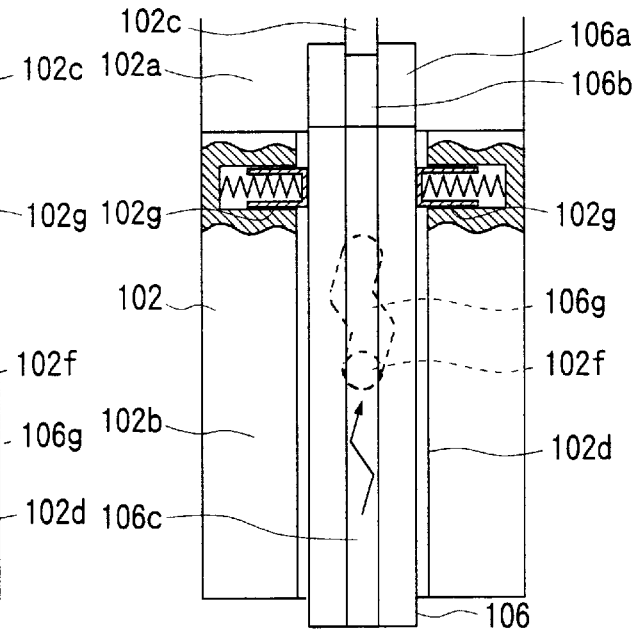

FIGS. 29 and 30 show another example of the vibration application mechanism. As shown in FIG. 29(a), the width of the groove 102d of the first spacer 102 is increased by a quantity of vibration (2×L2 in FIG. 30(a)), and a vibration pin 102f is provided in the center in the width direction of the groove 102d. Also, as shown in FIG. 28(b), the back face of the first take-in member 106 is provided with a corrugated groove (i.e., groove with corrugated faces) 106g, which slides along the vibration pin 102f. In addition, in the first spacer 102, spring loaded type movable spacers 102g for closing a gap corresponding to the aforementioned 2L are provided on the upper portion of the sliding groove 102d so that the spacers 102g contact the opposite faces of the first take-in member 106.

When the aforementioned first take-in member 106 is moved upward along the groove 102d of the first spacer 102 from the lowering position of FIG. 30(a), the first take-in member 106 is displaced right and left when the corrugate faces of the corrugated groove 106g slide on the vibration pin 102f. That is, the first take-in member 106 is moved along a locus such as that indicated by an arrow in FIG. 30(b), thereby applying microvibration to the first take-in member 106. Of course, similar microvibration can be applied when the first take-in member 106 falls. Since the gap in which the first take-in member 106 is displaced right and left can be absorbed by the movable spacer 102g, there is no possibility that the chip component P is fitted into the maximum gap corresponding to 2×L2.

Figure 31:
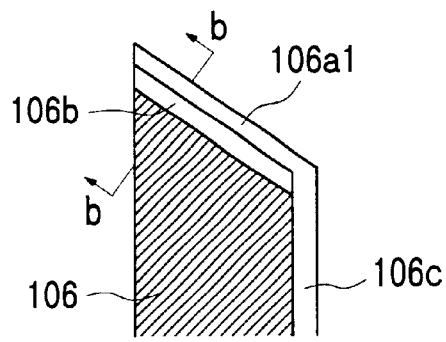
FIG. 31(a) is a partial vertical sectional view of the take-in members showing modification of shape of the take-in member.
FIG. 31(b) is a sectional view taken substantially along line b—b of FIG. 31(a)
Figure 31:
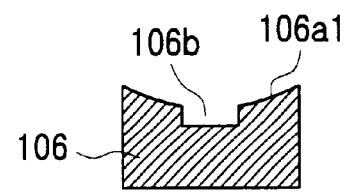

In the embodiment shown in FIGS. 16 to 26, the inclined face 106a is provided on the upper end of the first take-in member 106. However, in the case where there is the possibility that chip components P will stick to the flat portion other than the groove 106b of the inclined face 106a due to static electricity, the flat portion may be formed into a curved face 106a1, such as that shown in FIGS. 31(a) and 31(b), in order to avoid the face contact between it and the chip component. Of course, the inclined faces of the second take-in member 107 and the first and second spacers may also be formed into similar curved faces. In addition, when some microscopic stepped portions or protrusions are provided on the inclined face, similar advantages are obtainable.

Figure 32:
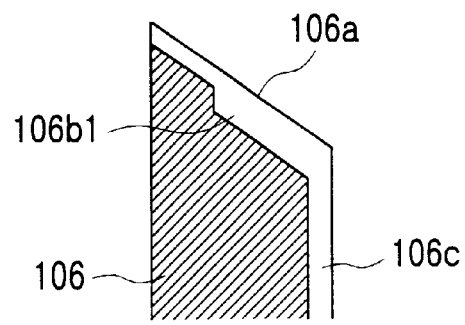
FIG. 32 is a partial vertical sectional view of the take-in member showing modification of the take-in member.

In the embodiment shown in FIGS. 16 to 26, while the groove 106b with a constant inclined angle has been provided the upper inclined face 106a of the first take-in member 106, a stepped groove 106b1 may be provided as shown in FIG. 32. In such a case, chip components P easily slide down the groove 106b1, and consequently, chip components can be efficiently taken into the vertical pipe 108. Of course, the guide grooves of the second take-in member 107 and the first and second spacers may also be provided with a similar stepped portion.

Figure 33:
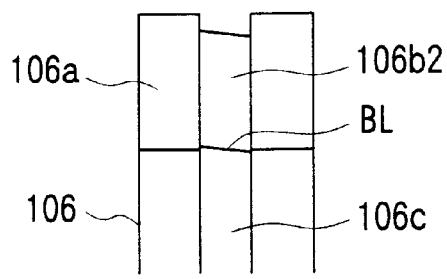
FIGS. 33(a) and 33(b) are partial front views of the take-in members showing a modification of shape of the upper end groove of the take-in member.
Figure 33:
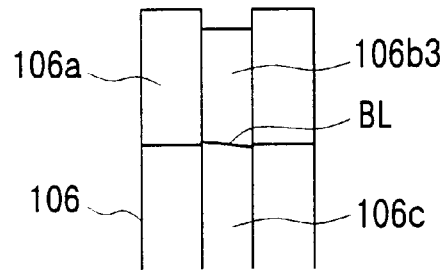

In the embodiment shown in FIGS. 16 to 26, the boundary between the grooves 106b and 106c of the first take-in member 106 is perpendicular to the direction in which chip components are taken in. However, in the case where there is the possibility that the chip component P will stop at the aforementioned boundary, the bottom face of the groove 106b2 may be non-parallel to the upper inclined face 106a to incline the boundary line BL between the bottom face of the groove 106b2 and the bottom face of the groove 106c, as shown in FIG. 33(a). Similarly, the bottom face of the groove 106b3 may have a twisted angle to incline the boundary line BL between the bottom face of the groove 106b3 and the bottom face of the groove 106c, as shown in FIG. 33(b). In such cases, the chip component P which attempts to stop at the aforementioned boundary becomes unsteady and can be removed from the boundary by making use of the inclination, and consequently, chip components can be efficiently taken into the vertical pipe 108.

Figure 34:
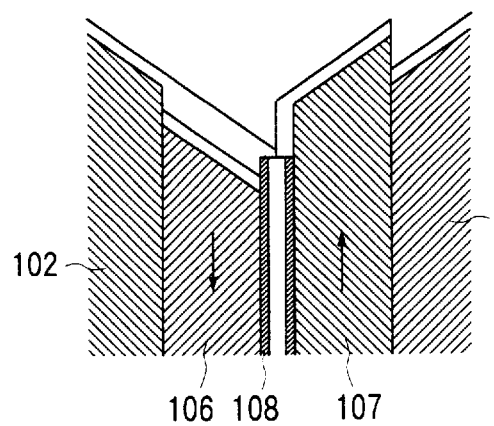
FIGS. 34(a) and 34(b) are vertical sectional views showing a modification of movement of the take-in members.
Figure 34:
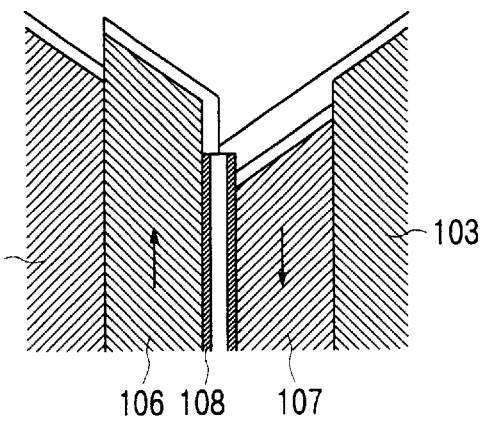

In the embodiment shown in FIGS. 16 to 26, although only one take-in member 106 of the two take-in members has been moved up and down, the same component take-in operation as the aforementioned can be performed even when two take-in members 106 and 107 are alternately moved up and down, as shown in FIGS. 34(a) and 13(b). In order to alternately move the take-in members 106 and 107 up and down, a link mechanism for coupling them so that they are freely rotatable can be suitably utilized in the center between them as a mechanism for rotating them in opposite directions. When done like this, the up-and-down movements of the take-in members 106 and 107 can be reduced and therefore the height dimension of the apparatus can be reduced.

In the aforementioned embodiments, although the curved passage 5a or curved passage 110a is provided to change the posture of the chip component P, it may be a vertical passage. Even when the chip component P from the vertical passage abuts the belt surface in a vertical posture, the chip component is pulled out of the passage by the advancing belt and lies on the advancing belt and, therefore, similar posture change can be performed.

In the aforementioned embodiments, although the transverse passage is formed by closing the opening of the linear groove 6a or 110b with the upper face of the belt, the present invention is not limited to the transverse passage. For example, the opening of the linear groove 6a or 110b may be closed to form a transverse passage by a stationary member. In this case, chip components can be conveyed by supplying air through the rear end of the transverse passage or by sucking in air at the front end.

What is claimed is:

1. A chip component take-in apparatus for prismatic chip components adapted to be stored in a bulk state in a chamber so the components are taken in one by one from the chamber and are guided downward from the chamber, comprising:
    a take-in member that is movable relative to the chamber and a take-in member that is stationary relative to the chamber, the members being adapted to be responsive to the components guided downward from the chamber, each of the take-in members having a flat face, said movable take-in member being movable to said stationary take-in member in a face contact state;
    the movable take-in member and the stationary take-in member being arranged so there is a passage between them, said passage including a groove at the stationary take-in member, a guide for the components on at least the movable take-in member of the take-in members, said guide being movable together with the movable take-in member, said guide and passage being arranged so the components in the chamber are taken in and guided downward from the chamber to the guide and then to the passage so the components are applied one by one in a predetermined direction by gravity when the movable take-in member is moved to the stationary take-in member in the face contact state.

2. The apparatus according to claim 1, wherein:
the movable take-in member is arranged to move up and down in a vertical direction.

3. The apparatus according to claim 1, wherein:
the guide includes a curved portion.

4. The apparatus according to claim 1, wherein:
the guide includes an inclined portion.

* * * * *